United States Patent
Higashijima et al.

(10) Patent No.: US 9,396,975 B2
(45) Date of Patent: Jul. 19, 2016

(54) LIQUID TREATMENT APPARATUS AND METHOD

(75) Inventors: Jiro Higashijima, Koshi (JP); Norihiro Itoh, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 1200 days.

(21) Appl. No.: 13/355,877

(22) Filed: Jan. 23, 2012

(65) Prior Publication Data

US 2012/0186744 A1  Jul. 26, 2012

(30) Foreign Application Priority Data

Jan. 25, 2011 (JP) ................................. 2011-013458

(51) Int. Cl.
*B08B 3/00* (2006.01)
*H01L 21/67* (2006.01)
*H01L 21/687* (2006.01)

(52) U.S. Cl.
CPC .... *H01L 21/67051* (2013.01); *H01L 21/68707* (2013.01); *H01L 21/68728* (2013.01); *H01L 21/68785* (2013.01); *H01L 21/68792* (2013.01)

(58) Field of Classification Search
None
See application file for complete search history.

(56) References Cited

U.S. PATENT DOCUMENTS 6,805,754 B1   10/2004  Pokorny et al.
2007/0275562 A1  11/2007  Kim et al.

FOREIGN PATENT DOCUMENTS

| JP | 2002-533920 A1 | 10/2002 |
| JP | 2005-353739 A1 | 12/2005 |
| JP | 2007-180144 A1 | 7/2007 |
| JP | 2007-318140 A1 | 12/2007 |
| WO | 00/38220 A1 | 6/2000 |

OTHER PUBLICATIONS

Japanese Office Action (Application No. 2011-013458) dated Jan. 24, 2014 Not in English. Considered to the extent it could be understood.

*Primary Examiner* — Eric Golightly
(74) *Attorney, Agent, or Firm* — Burr & Brown, PLLC

(57) ABSTRACT

A liquid treatment apparatus includes a substrate retaining unit, a rotational driving unit configured to rotate the substrate retaining unit; and a nozzle disposed below a lower surface of the substrate, the nozzle having first ejection ports provided to eject a chemical liquid and second ejection ports provided to eject a rinsing fluid towards the lower surface of the substrate. The nozzle comprises a first portion and a second portion each extending from a position opposing to a peripheral portion of the substrate towards a position opposing to a central portion of the substrate. At least part of the first ejection ports are arranged in the first portion. At least part of the second ejection ports are arranged in the second portion. The first portion and the second portion are arranged to form a V-shaped figure.

5 Claims, 12 Drawing Sheets

LIQUID TREATMENT APPARATUS AND METHOD

CROSS-REFERENCE TO RELATED APPLICATION

This application is based on and claims the benefit of priorities from Japanese Patent Application No. 2011-013458 filed on Jan. 25, 2011, the entire contents of which are incorporated herein by reference.

FIELD OF THE INVENTION

The present disclosure relates to a liquid treatment apparatus and a liquid treatment method used to conduct liquid treatment such as cleaning and etching for substrates by supplying a treatment liquid to a lower surface of the substrate while spinning it.

DESCRIPTION OF RELATED ART

In a semiconductor manufacturing process, substrates such as semiconductor wafers are subjected to cleaning or etching with use of a chemical liquid in order to remove undesired films adhering to the front or back surface of the wafer (e.g., oxide films, nitride films, or resist films having been used as a mask).

US2007/0275562A discloses a substrate treatment apparatus that executes the aforementioned chemical-liquid cleaning process and the successive rinsing process continuously. The substrate treatment apparatus includes a spin head for retaining a wafer at its peripheral edge and rotating the wafer, and a spray head provided on the spin head to supply a treatment fluid upon a lower surface of the wafer.

In the substrate treatment apparatus described in US2007/0275562A, during chemical liquid treatment, a chemical liquid sprayed upon the lower wafer surface from a bar-shaped member for spraying chemical liquid may drop due to gravity and adhere onto another bar-shaped member for spraying rinsing liquid. In addition, rotation of the spin head and the wafer causes an airflow which affects the sprayed chemical liquid to flow in the rotating direction of the wafer. This may also result in the adhesion of chemical liquid onto the bar-shaped member for spraying rinsing liquid. If the chemical liquid adheres on the bar-shaped member for spraying rinsing liquid, the chemical liquid possibly contaminates the rinsing liquid. If the adhering chemical liquid dries, it may become a cause of particles.

SUMMARY OF THE INVENTION

The present disclosure provides a liquid treatment apparatus that prevents or reduces adhesion of a chemical liquid, which have been once ejected from an ejecting member for chemical liquid ejection to a lower surface of a substrate, onto another jetting member for ejecting a rinsing fluid.

In one embodiment, there is provided a liquid treatment apparatus including: a substrate retaining unit comprising a retaining member configured to hold a peripheral edge of a substrate to retain the substrate horizontally; a rotational driving unit configured to rotate the substrate retaining unit; and a nozzle disposed below a lower surface of the substrate retained by the substrate retaining unit, the nozzle comprising a plurality of first ejection ports provided to eject a chemical liquid towards the lower surface of the substrate retained by the substrate retaining unit and a plurality of second ejection ports provided to eject a rinsing fluid towards the lower surface of the substrate retained by the substrate retaining unit; wherein: the nozzle comprises a first portion extending from a position opposing to a peripheral portion of the substrate towards a position opposing to a central portion of the substrate retained by the substrate retaining unit, the plurality of first ejection ports are arranged between a position opposing to a peripheral portion of the substrate towards a position opposing to a central portion of the substrate retained by the substrate retaining unit, and at least part of the plurality of first ejection ports are arranged in the first portion; the nozzle comprises a second portion extending from a position opposing to a peripheral portion of the substrate towards a position opposing to a central portion of the substrate retained by the substrate retaining unit, the plurality of second ejection ports are arranged between a position opposing to a peripheral portion of the substrate towards a position opposing to a central portion of the substrate retained by the substrate retaining unit, and at least part of the plurality of second ejection ports are arranged in the second portion; the first portion and the second portion are arranged to form a V-shaped figure; and the first portion is disposed at an angular position advanced through a certain angle from the second portion in a rotating direction of the substrate rotated by the rotational driving unit.

In another embodiment, there is provided a liquid treatment method including: providing the foregoing liquid treatment apparatus; retaining a substrate in a horizontal posture by the substrate retaining unit; rotating the substrate retained by the substrate retaining unit, with the first portion of the nozzle being disposed at an angular position advanced through an angle from the second portion in a rotating direction of the substrate; supplying a chemical liquid from the first ejection ports of the nozzle to a lower surface of the substrate; and thereafter supplying a rinsing fluid from the second ejection ports of the nozzle to the lower surface of the substrate.

According to the foregoing embodiments, a chemical liquid ejected from the first portion is less likely to reach the second portion, whereby preventing or reducing contamination of the second portion with the chemical liquid. In addition, the first portion can be cleaned by the rinsing fluid ejected from the second portion. The nozzle can thus be kept clean.

In another embodiment, there is provided a liquid treatment apparatus including: a substrate retaining unit comprising a retaining member configured to hold a peripheral edge of a substrate to retain the substrate horizontally; a rotational driving unit configured to rotate the substrate retaining unit; and a nozzle disposed below a lower surface of the substrate retained by the substrate retaining unit, the nozzle comprising a plurality of first ejection ports provided to eject a chemical liquid towards the lower surface of the substrate retained by the substrate retaining unit and a plurality of second ejection ports provided to eject a rinsing fluid towards the lower surface of the substrate retained by the substrate retaining unit; wherein: the nozzle comprises a first portion extending from a position opposing to a peripheral portion of the substrate towards a position opposing to a central portion of the substrate retained by the substrate retaining unit, the plurality of first ejection ports are arranged between a position opposing to a peripheral portion of the substrate towards a position opposing to a central portion of the substrate retained by the substrate retaining unit, and at least part of the plurality of first ejection ports are arranged in the first portion; the nozzle comprises a second portion extending from a position opposing to a peripheral portion of the substrate towards a position opposing to a central portion of the substrate retained by the substrate retaining unit, the plurality of second ejection ports are arranged between a position opposing to a peripheral portion of the substrate towards a position opposing to a central portion of the substrate retained by the substrate retaining unit, and at least part of the plurality of second ejection ports are arranged in the second portion; the first portion and the second portion are arranged to form a V-shaped figure with the first and second portions making an acute angle therebetween; and each of the first ejection ports arranged in the first portion is configured to eject the chemical liquid in a direction away from the second portion.

DETAILED DESCRIPTION OF THE INVENTION

Figure 1:
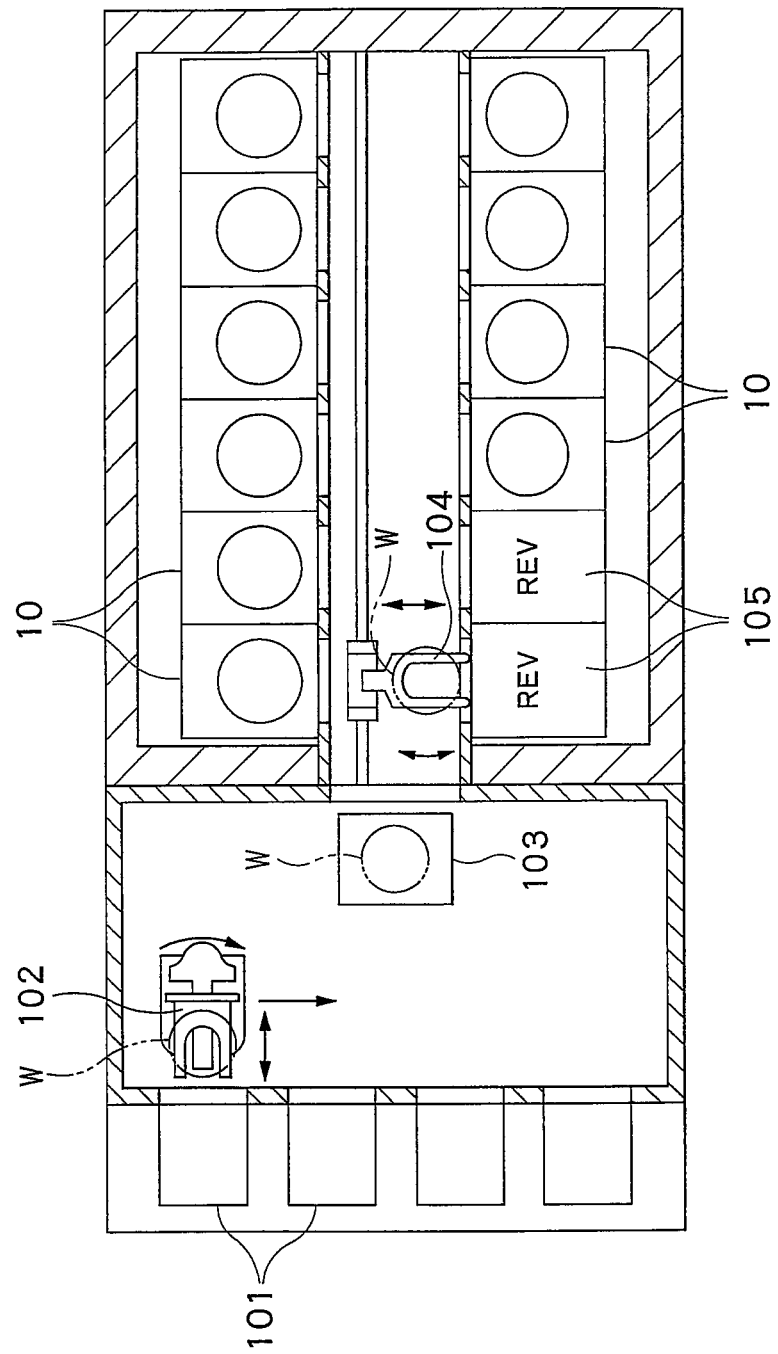
FIG. 1 is a top plan view of a liquid treatment system which includes substrate cleaning apparatuses in one embodiment.

An embodiment of a liquid treatment apparatus will be described with reference to the accompanying drawings. First, a liquid treatment system including a substrate cleaning apparatus in one embodiment of a liquid treatment apparatus will be described below with reference to FIG. 1. As shown in FIG. 1, the liquid treatment system includes: mounting tables 101 each for mounting thereon a carrier accommodating a semiconductor wafer W (i.e., substrate to be processed) (hereinafter, simply referred to as "wafer W") which is transported thereto from the outside of the system; a transport arm 102 for removing the wafer W from the carrier; a shelf unit 103 for placing thereon the wafer W removed from the carrier by the transport arm 102; and a transport arm 104 for receiving the wafer W from the shelf unit 103 and for transporting the wafer W to the substrate cleaning apparatus 10. As shown in FIG. 1, a plurality of (ten, in the embodiment of FIG. 1) liquid treatment apparatuses and two wafer reversers 105 are installed in the liquid treatment system. The transport arm 104 has substantially a U-shape in top plan view, and is shaped such that transport arm 104 does not touch the lift pins 22 (described later) and a V-shaped nozzle 60 (also described later) when the transport arm 104 places the wafer W onto or remove the wafer W from the lift pins 22 (see FIG. 10B).

Next, a schematic configuration of one substrate cleaning apparatus 10 is described below with reference to FIGS. 2A and 2B. The substrate cleaning apparatus 10 has a chamber 12 (only shown in FIG. 2A), and within the chamber 12, a retaining plate 30 for retaining the wafer W; a lift pin plate 20 provided above the retaining plate 30 and including lift pins 22 to support the wafer W from below; a rotational driving unit 39 equipped with an electric motor or the like to rotate the retaining plate 30; a treatment fluid supply pipe 40 routed through a through-hole 30a formed centrally in the retaining plate 30 and a through-hole 20a formed centrally in the lift pin plate 20; a V-shaped nozzle 60 for spraying, towards a lower surface of the wafer W, a treatment fluid supplied via the treatment fluid supply pipe 40; and a cover member 80 incorporating a heater which is movable to a position near the upper surface of the wafer W retained by the retaining plate 30 so as to shroud the upper wafer W surface. The lift pin plate 20 is constructed to rotate in association with the retaining plate 30 during treatment. In the ceiling of the chamber 12, a fan filter unit (FFU) 14 is provided to generate a downward flow of clean air in the chamber 12. An inner sidewall of the chamber 12 (i.e., the right inner sidewall in FIG. 2A) is provided with a wafer loading/unloading port (not shown)

that includes a shutter member (also not shown), through which the transport arm 104 retaining the wafer W enters the chamber. In FIG. 2A, the ceiling of the chamber 12 is illustrated at a lower position than a position where it actually resides for convenience sake. In an actual case the ceiling is at a height such that the transport arm 104 is able to move up as shown in FIG. 2B and the cover member 80 can shift to its upper position.

The lift pin plate 20, the treatment fluid supply pipe 40, and the V-shaped nozzle 60 can be moved vertically in a relative fashion with respect to the retaining plate 30. FIG. 2A shows a state where the lift pin plate 20, the treatment fluid supply pipe 40, and the V-shaped nozzle 60 are positioned at their respective lower positions. FIG. 2B shows a state where the lift pin plate 20, the treatment fluid supply pipe 40, and the V-shaped nozzle 60 are positioned at their respective upper positions. The lift pin plate 20, the treatment fluid supply pipe 40, and the V-shaped nozzle 60 move up and down between their lower positions shown in FIG. 2A and their upper positions shown in FIG. 2B. The cover member 80 is at a treating position (lower position) in FIG. 2A. In FIG. 2B, the cover member 80 is not shown but it is actually present at its standby position (upper position) above the wafer W illustrated with double-dashed lines.

Next, each constituent element of the substrate cleaning apparatus 10 is described in detail. As shown in FIG. 3, the lift pin plate 20 has a disk-like shape with the through-hole 20a formed in its central portion. An annular protrusion 20b is provided around the through-hole 20a to prevent a liquid on the lift pin plate 20 from entering the through-hole 20a. The treatment fluid supply pipe 40 is routed through the through-hole 20a. The lift pin plate 20 comprises thereon a plurality of (in the present example, four) lift pins 22 near its peripheral edge. In this embodiment, as shown in FIG. 2C, four lift pins 22 are paired into two pairs. One of the pair, lift pins 22a and 22a' (the two located on the left in FIG. 2C) are arranged at an interval such that the two lines connecting the lift pins 22a and 22a' with the center of the plate 20 form an acute angle of 30 degrees. The other pair, lift pins 22b and 22b' (the two located on the right in FIG. 2C) are arranged at an interval such that the two lines connecting the lift pins 22b and 22b' with the center of the plate 20 form an obtuse angle of 120 degrees. The four lift pins 22 are disposed line-symmetrically with respect to an imaginary line passing through the center of the wafer W and extending in a horizontal direction in FIG. 2C. Such layout not only enables the lift pins 22 to stably support the wafer W but also allows the U-shaped transport arm 104 to enter beneath the wafer W for loading/unloading (from the right to the left in FIG. 2C) without being obstructed by the lift pins 22 (see FIGS. 2B and 10B). The lower surface of the lift pin plate 20 has a plurality of, for example three, rod-like connecting members 24 extending downward. The lower surface of the plate 20 here indicates the surface opposite to the surface having the lift pins 22. The connecting members 24 are arranged near the peripheral edge of the plate 20 at equal intervals in the circumferential direction of the plate 20.

Figure 4:
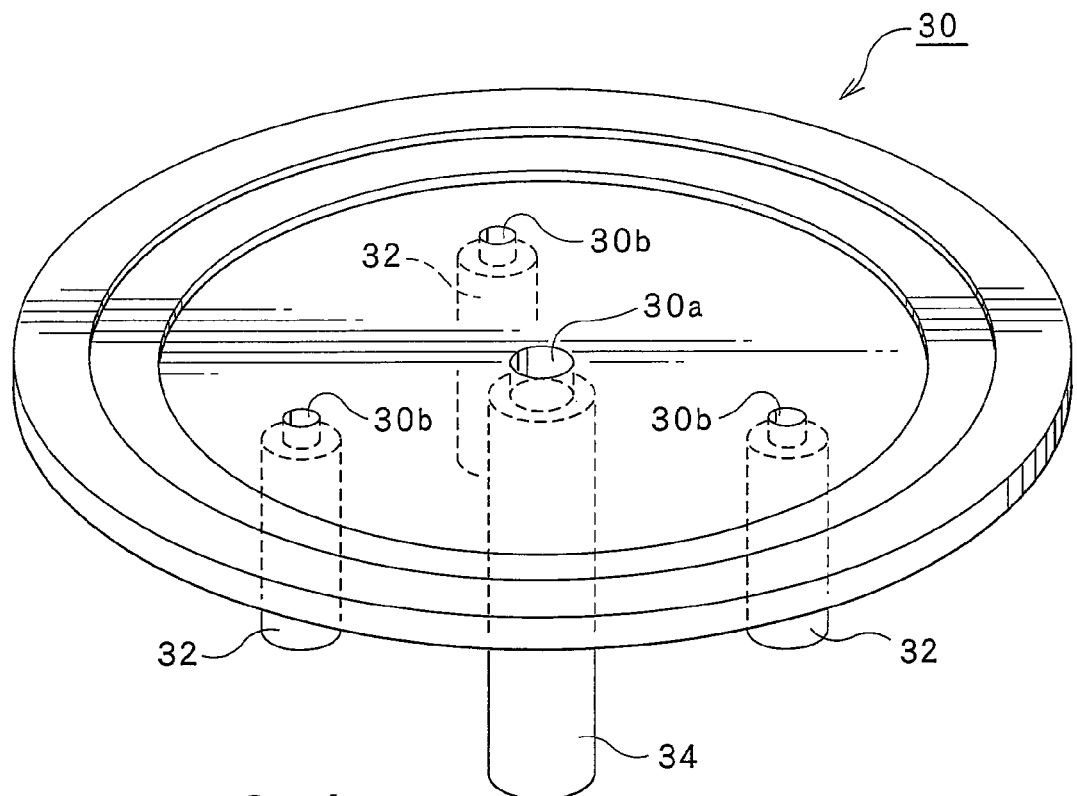
FIG. 4 is a perspective view showing the configuration of a retaining plate of the substrate cleaning apparatus shown in FIGS. 2A and 2B.

As shown in FIG. 4, the retaining plate 30 has a disk-like shape with the through-hole 30a formed in its central portion. The treatment fluid supply pipe 40 is routed through the through-hole 30a. A rotary cup 36 is attached to the retaining plate 30 via a connecting member 38 as shown in FIG. 2A. When the lift pin plate 20, the treatment fluid supply pipe 40, and the bar-shaped nozzle 60 are at their lowered positions, the rotary cup 36 encircles the peripheral edge of the wafer W retained by the retaining plate 30. As shown in FIGS. 2A and 2C, two fixed retaining members 37 are attached to the rotary cup 36 to retain the wafer W. The detailed function of the fixed retaining members 37 will be described later. Instead of attaching the fixed retaining members 37 to the rotary cup 36, they may be connected to the retaining plate 30, or may be directly attached to the connecting member 38. If the fixed retaining members 37 are attached directly to the connecting member 38, the fixed retaining members 37 can be enhanced in strength against a force applied from a horizontal direction.

A hollow rotating shaft 34 is attached to the central portion of the lower surface of the retaining plate 30 (i.e., the surface opposite to the surface equipped with the rotary cup 36) to extend downward therefrom. The treatment fluid supply pipe 40 is accommodated in the cavity of the hollow rotating shaft 34. The rotating shaft 34 is supported by a bearing (not shown) and is rotated by the rotational driving unit 39 comprising an electric motor and so on. The rotational driving unit 39 rotates the rotating shaft 34, thus rotating the retaining plate 30 as well.

As shown in FIG. 4, three through-holes 30b (connecting member through-holes) are formed in the retaining plate 30. The connecting members 24 coupled to the lift pin plate 20 are each inserted slidably in the through-hole 30b. The connecting members 24 connect the retaining plate 30 and the lift pin plate 20 for their integral rotation while preventing relative rotation between them; the connecting members 24 permit relative vertical movement between the retaining plate 30 and the lift pin plate 20. The through-holes 30b are arranged in the retaining plate 30 at equal angular intervals on a circumference on the retaining plate 30. In addition, on the lower surface of the retaining plate 30, the through-holes 30b are provided with three accommodation members 32 having a cylindrical shape. The accommodation members 32 extend downward from the lower surface of the retaining plate 30 and accommodate the connecting members 24 extending downward from the lower surface of the lift pin plate 20. The accommodation members 32 are arranged at equal angular intervals on a circumference near a peripheral area of the retaining plate 30.

Figure 5:
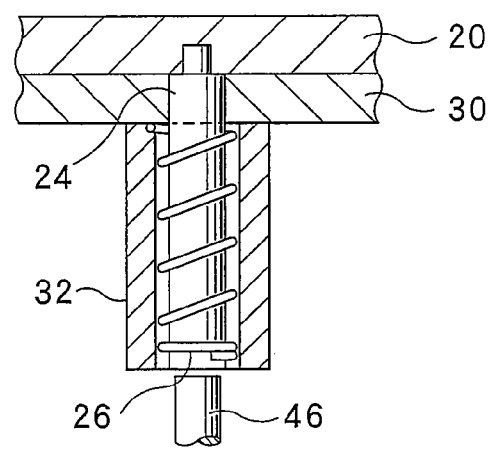
FIG. 5 is an enlarged vertical cross sectional view showing the configuration of a connecting member extending downward from the lift pin plate and a hollow accommodation member extending downward from the retaining plate and accommodating the connecting member in the substrate cleaning apparatus shown in FIGS. 2A and 2B.

Referring to FIG. 5, a further detailed description will be made for the connecting members 24 extending downward from the lower surface of the lift pin plate 20, and the accommodation members 32 extending downward from the lower surface of the retaining plate 30. As shown in FIG. 5, the cylindrical accommodation member 32 has an inside diameter slightly greater than an outside diameter of the connecting member 24. The connecting member 24 can move in a longitudinal direction of the accommodation member 32 (i.e., vertical direction in FIG. 5) in the accommodation member 32. As shown in FIG. 2A, when the lift pin plate 20 is at its lowered position, the connecting member 24 is completely received in the accommodation member 32. Meanwhile, as shown in FIG. 2B, when the lift pin plate 20 is at its raised position, only a lower portion of the connecting member 24 is received in the accommodation member 32. The connecting member 24 passes through the through-hole 30b in the retaining plate 30 and protrudes upward from the retaining plate 30.

As shown in FIG. 5, a spring 26 is installed in the cavity of the accommodation member 32 in a compressed state. The lower end of the spring 26 is connected to the bottom of the connecting member 24 while its upper end is connected to the lower surface of the retaining plate 30 in the vicinity of the through-hole 30b. Thus, the spring 26 urges the connecting member 24 downward. In other words, force of the spring 26 to return from the compressed state to an original state exerts a downward force upon the connecting member 24 (i.e., force to move downward from the retaining plate 30).

Figure 2A:
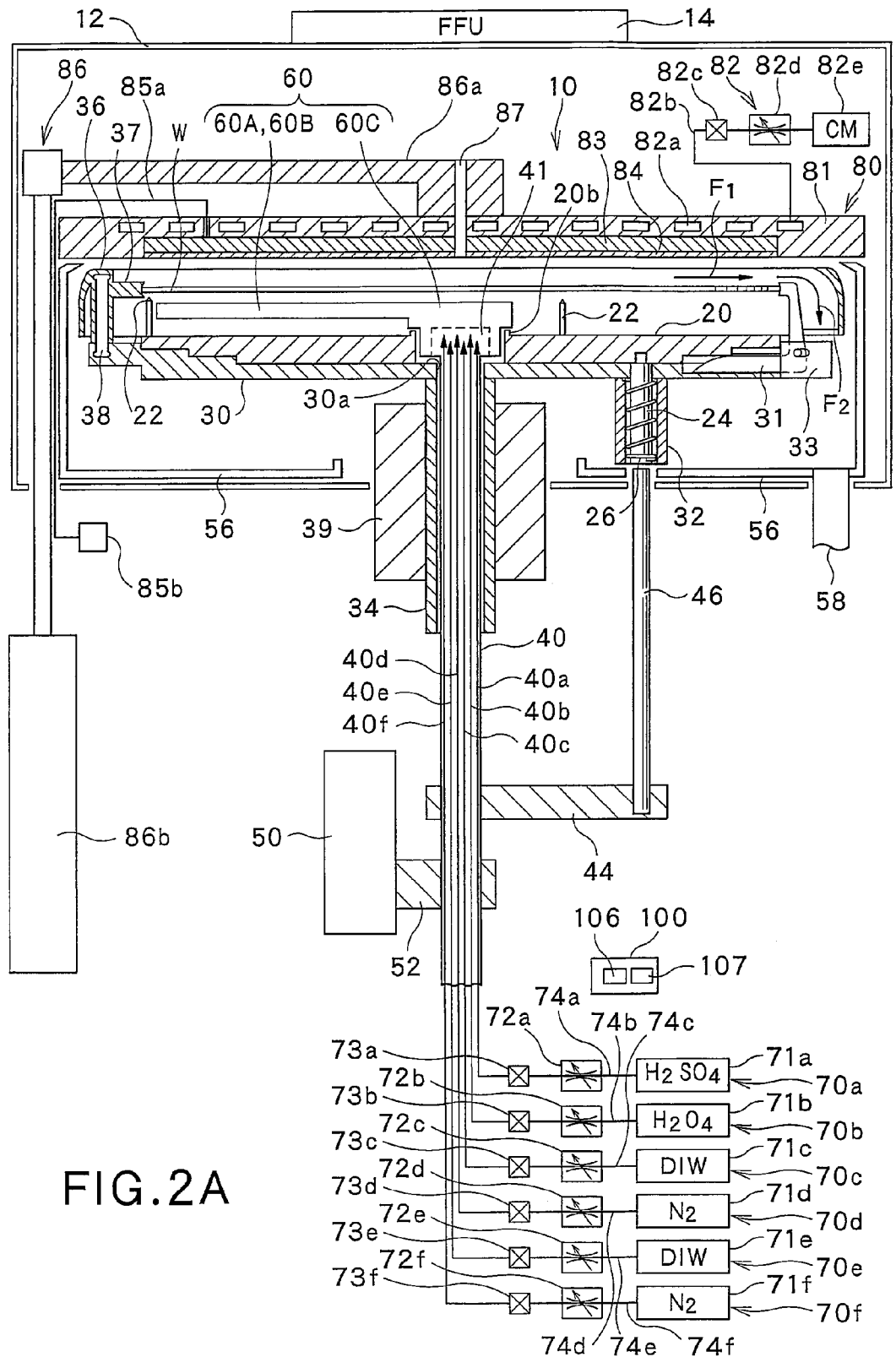
FIG. 2A is a vertical cross sectional view showing the configuration of the substrate cleaning apparatus in a state where a lift pin plate and a cleaning liquid supply pipe are located at their lowered positions.
Figure 2B:
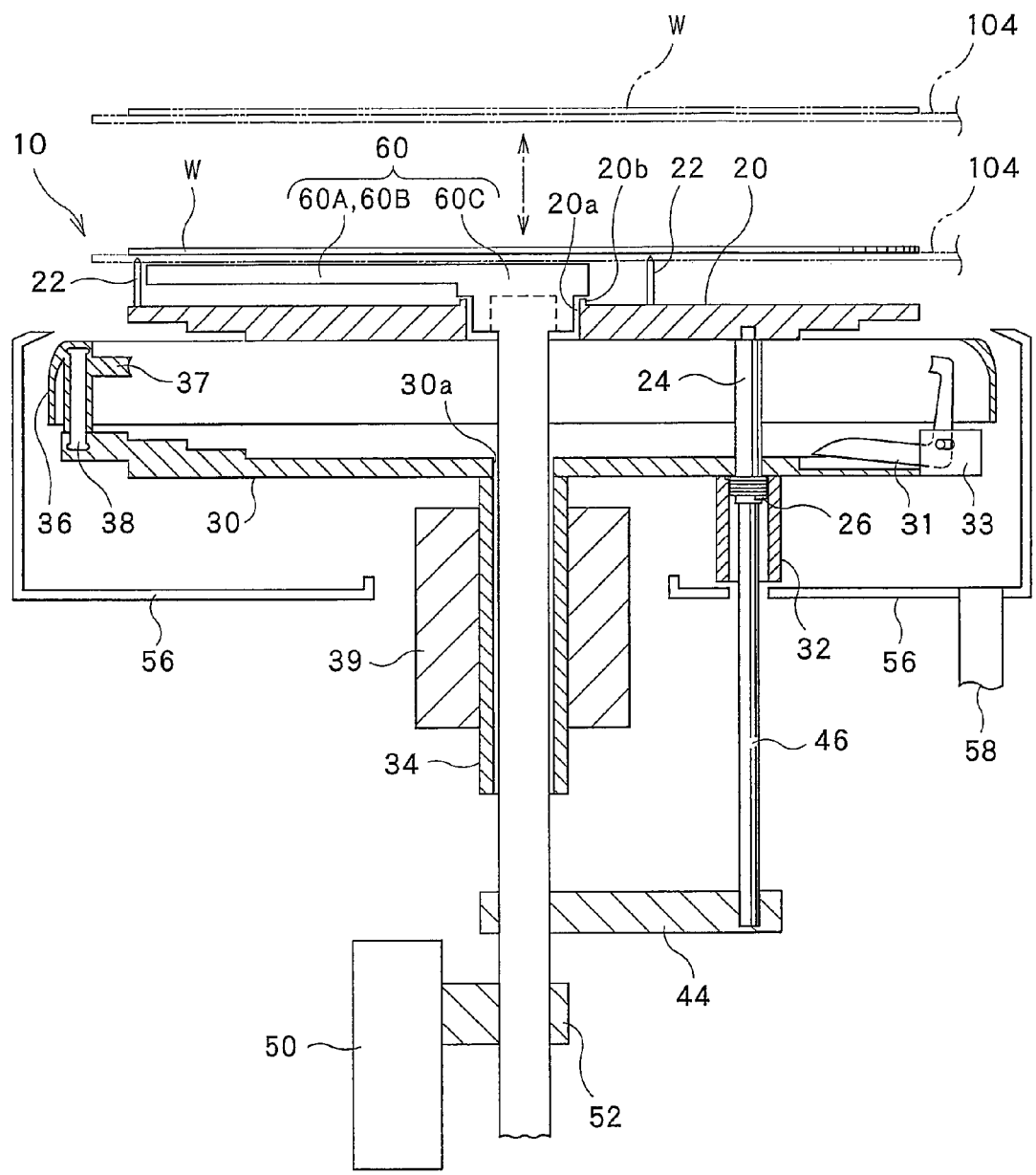
FIG. 2B is a vertical cross sectional view showing the configuration of the substrate cleaning apparatus in a state where the lift pin plate and the cleaning liquid supply pipe are located at their raised positions.
Figure 2C:
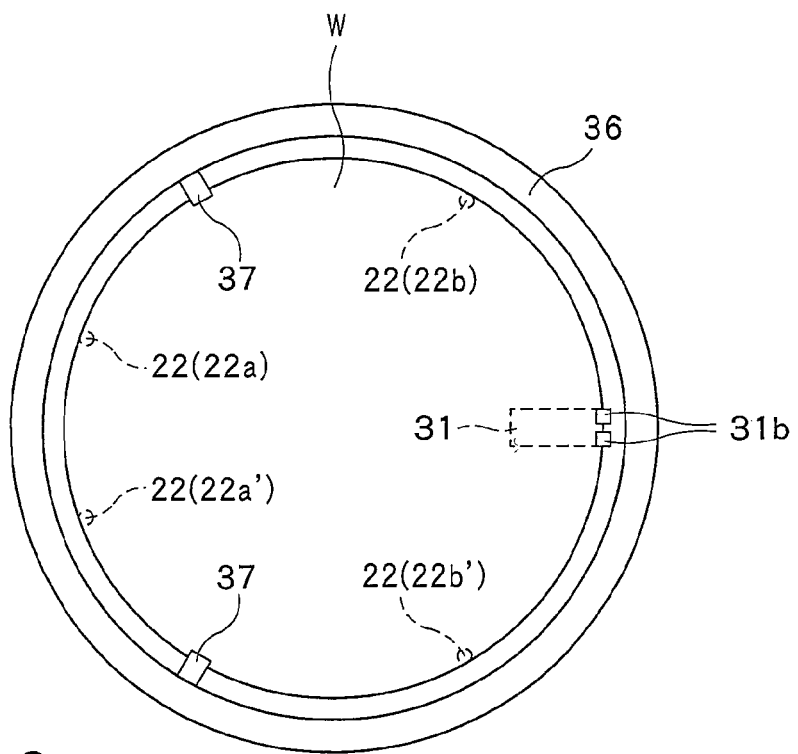
FIG. 2C is a top plan view of the substrate cleaning apparatus in a state where a wafer is retained by a substrate retaining member and fixed retaining members as shown in FIG. 2A.
Figure 3:
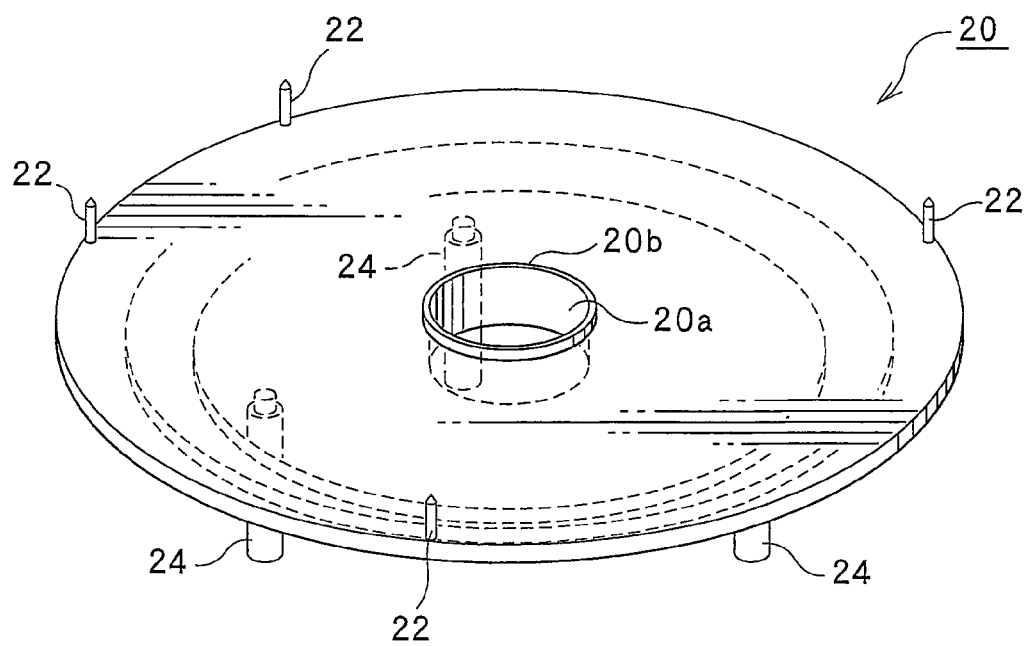
FIG. 3 is a perspective view showing the configuration of the lift pin plate of the substrate cleaning apparatus shown in FIGS. 2A and 2B.

As shown in FIGS. 2A and 2B, an outer cup 56 is provided outside the rotary cup 36 to surround the retaining plate 30 and the rotary cup 36. In addition, a drainage tube 58 is connected to the outer cup 56. During cleaning of a wafer W, used cleaning liquid scatters outward from the wafer W due to its rotation. The scattered liquid will be received by the outer cup 56 and is drained through the drainage tube 58.

As can be seen in FIG. 2A, a movable, substrate retaining member 31 for supporting the wafer W from the lateral side of the wafer W is provided on the retaining plate 30. When the lift pin plate 20 is at its lowered position as in FIG. 2A, the substrate retaining member 31 supports the wafer W from its lateral side. When the lift pin plate 20 is at its raised position as shown in FIG. 2B, the substrate retaining member 31 is separated away from the wafer W. The operation of the substrate retaining member 31 will be described more specifically with reference to FIG. 2C. During wafer cleaning, the wafer W is retained by the substrate retaining member 31 and the two fixed retaining members (i.e., non-movable, substrate-retaining members) 37. At this time, the substrate retaining member 31 presses the wafer W against the two fixed retaining members 37. That is, the substrate retaining member 31 applies to the wafer W a leftward force to press the wafer W against the fixed retaining members 37. In the illustrated embodiment, since the wafer W is retained by two fixed retaining members 37 and only one movable substrate-retaining member 31, the configuration for retaining the wafer W can be more simplified as compared with a configuration employing a plurality of movable substrate retaining members 31 with no fixed retaining member 37.

Figure 6:
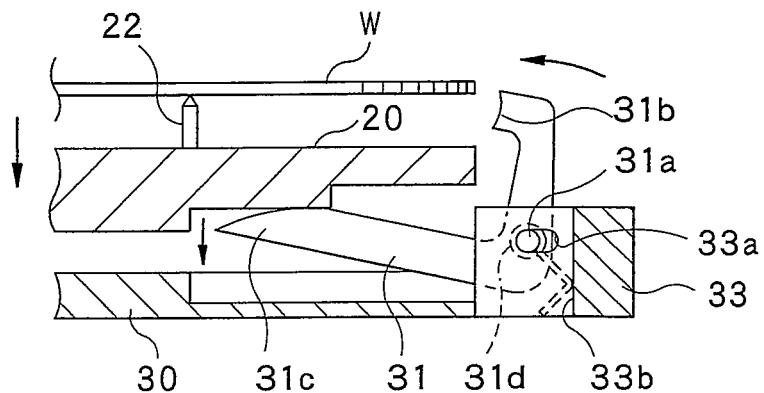
FIG. 6 is an enlarged vertical cross sectional view showing the configuration of the substrate retaining member provided on the retaining plate in the substrate cleaning apparatus shown in FIGS. 2A and 2B.
Figure 7:
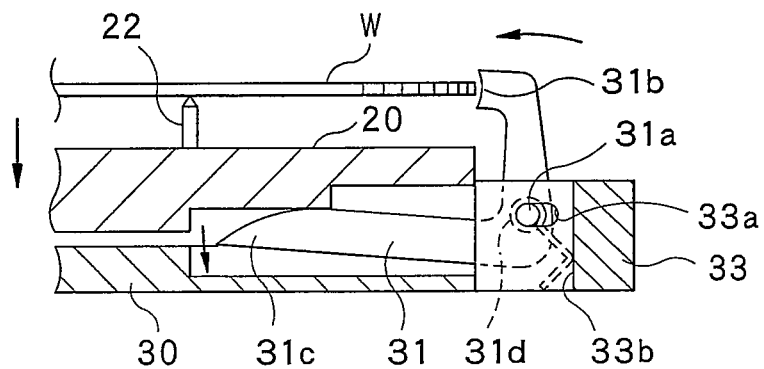
FIG. 7 is an enlarged vertical cross sectional view showing a state where the lift pin plate has been moved downward from the state shown in FIG. 6.
Figure 8:
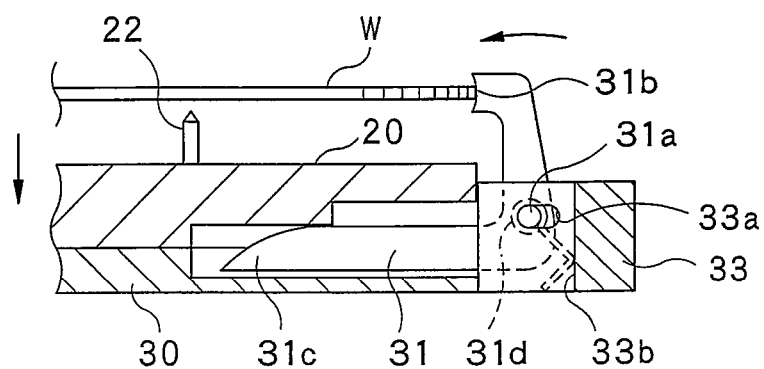
FIG. 8 is an enlarged vertical cross sectional view showing a state where the lift pin plate has been moved further downward from the state shown in FIG. 7.

Then, the configuration of the substrate retaining member 31 will be detailed below referring to FIGS. 6 to 8. FIG. 6 shows a state where the lift pin plate 20 is moving from its raised position as in FIG. 2B to its lowered position as in FIG. 2A. FIG. 7 shows a state where the lift pin plate has moved more downward from the state shown in FIG. 6. FIG. 8 shows a state where the lift pin plate 20 has moved further downward from the state of FIG. 7 to reach the lowered position as shown in FIG. 2A.

As shown in FIGS. 6 to 8, the substrate retaining member 31 is supported by the retaining plate 30 via an axle 31a. More specifically, a bearing unit 33 is attached to the retaining plate 30, and an axle receiving hole 33a of the bearing unit 33 receives the axle 31a. The axle receiving hole 33a is an elongated hole extending in a horizontal direction, and the substrate retaining member 31 can move horizontally along the axle receiving hole 33a. The substrate retaining member 31 can thus swing around the axle 31a accommodated within the axle receiving hole 33a of the bearing unit 33.

A spring member 31d such as a torsion spring is wound around the axle 31a of the substrate retaining member 31. The spring member 31d is adapted to impart the substrate retaining member 31 a force to rotate the substrate retaining member 31 around the axle 31a in the clockwise direction in FIGS. 6 to 8. Thus, when no force is applied to the substrate retaining member 31, the substrate retaining member 31 inclines with respect to the retaining plate 30, as shown in FIG. 2B. A substrate retaining portion 31b (described later) of the substrate retaining member 31, provided to hold the wafer W from its lateral side, then moves away from a central portion of the retaining plate 30.

The spring member 31d has a linear portion extending outward from the axle 31a to an inner wall 33b of the bearing unit 33. The linear portion is engaged with the inner wall 33b, thereby pushing back the axle 31a towards the center of the retaining plate 30. The axle 31a is thus constantly pushed towards the center (leftward in FIGS. 6 to 8) of the retaining plate 30 by the linear portion of the spring member 31d. When the movable substrate retaining member 31 and the fixed retaining members 37 are supporting a wafer W having a relatively small diameter, the axle 31a is positioned in the axle receiving hole 33a at a position nearer to the center (left side) of the retaining plate 30, as shown in FIGS. 6 to 8. When the movable substrate-retaining member 31 and the fixed retaining members 37 is supporting a wafer W having a relatively large diameter, the axle 31a moves rightward along the axle receiving hole 33a from the position shown in FIGS. 6 to 8, against the force applied by the linear portion of the spring member 31d. The magnitude of the wafer diameter (small/large diameter) here refers to a magnitude that falls within a tolerance range.

The substrate retaining member 31 has, in addition to the substrate retaining portion 31b that retains the wafer W from its lateral side, a pressure receiving member 31c at the side opposite to the substrate retaining portion 31b with respect to the axle 31a. The pressure receiving member 31c is set between the lift pin plate 20 and the retaining plate 30. When the lift pin plate 20 is at or near the lowered position, the lower surface of the lift pin plate 20 pushes the pressure-receiving member 31c downward as shown in FIGS. 6 to 8.

While the lift pin plate 20 moves from its raised position to its lowered position, the lower surface of the lift pin plate 20 pushes the pressure receiving member 31c downward. Then, the substrate retaining member 31 rotates counterclockwise around the axle 31a (in a direction shown by the arrows in FIGS. 6 to 8). This rotation of the substrate retaining member 31 around the axle 31a renders the substrate retaining portion 31b to approach the wafer W from its lateral side. The wafer W is held from its lateral side by the substrate retaining member 31, as the lift pin plate 20 reaches the lowered position as in FIG. 8. At this time when the wafer W is held at its lateral side by the substrate retaining member 31, the wafer W is separated from the tip of each lift pin 22 and is held above the lift pins 22. Depending on the size of the wafer W, the axle 31a may slide rightwards along the axle receiving hole 33a from the position shown in FIGS. 6 to 8, against the force applied by the linear portion of the spring member 31d. Therefore, the wafer W can be held from its lateral side without deforming nor damaging it even if the substrate retaining member 31 and the fixed retaining members 37 hold a relatively large wafer W, because the substrate retaining member 31 can shift in the horizontal direction.

By employing such substrate retaining member 31, the substrate cleaning apparatus 10 do not need a special driving mechanism (motive energy source) for driving a substrate retaining member 31. The substrate retaining member 31 of the retaining plate 30 can retain and release a wafer W just by vertically moving the lift pin plate 20 using a vertical driving unit 50 (described later). The configuration of the substrate cleaning apparatus 10 can thus be simplified. It also reduces the time lag between the timing of raising and lowering of the lift pin plate 20 and the timing of the action of the substrate retaining member 31, whereby improving throughput.

As shown in FIGS. 2A and 2B, the treatment fluid supply pipe 40 is arranged to pass through both the through-hole 20a in the lift pin plate 20 and the through-hole 30a in the retaining plate 30. The treatment fluid supply pipe 40 is arranged such that it does not rotate when the lift pin plate 20 and the retaining plate 30 rotate. A plurality of (six, in the illustrated embodiment), fluid supply passages for supplying treatment fluids to the V-shaped nozzle 60 are accommodated inside the treatment fluid supply pipe 40. The six fluid supply passages are: a first fluid supply passage 40a (also termed as "sulfuric acid supply passage"); a second fluid supply passage 40b (also termed as "hydrogen peroxide solution supply passage"); a third fluid supply passage 40c (also termed as "first DIW supply passage"); a fourth fluid supply passage 40*d* (also termed as "first N$_2$ gas supply passage"); a fifth fluid supply passage 40*e* (also termed as "second DIW supply passage"); and a sixth fluid supply passage 40*f* (also termed as "second N$_2$ gas supply passage"). These six fluid supply passages extend in a vertical direction inside the treatment fluid supply pipe 40. The V-shaped nozzle 60 which will be detailed later is attached on the upper end of the treatment fluid supply pipe 40.

As shown in FIG. 2A, the first to sixth fluid supply passages 40*a*, 40*b*, 40*c*, 40*d*, 40*e*, 40*f* in the treatment fluid supply pipe 40 are connected to corresponding first to sixth fluid supply mechanisms 70*a*, 70*b*, 70*c*, 70*d*, 70*e*, 70*f*, respectively.

The first fluid supply mechanism 70*a* is for supplying sulfuric acid (H$_2$SO$_4$) and is hereinafter referred to as the sulfuric acid supply mechanism 70*a*. The sulfuric acid supply mechanism 70*a* is connected to a sulfuric acid supply source 71*a* via a line 74*a* which is provided with, from the upstream, a variable throttle valve 72*a* and an open/close valve 73*a*.

The second fluid supply mechanism 70*b* is for supplying hydrogen peroxide solution (H$_2$O$_2$) and is hereinafter referred to as the hydrogen peroxide solution supply mechanism 70*b*. The hydrogen peroxide solution supply mechanism 70*b* is connected to a hydrogen peroxide solution supply source 71*b* via a line 74*b* which is provided with, from the upstream, a variable throttle valve 72*b* and an open/close valve 73*b*.

The third fluid supply mechanism 70*c* is for supplying de-ionized water (DIW) as a rinsing liquid and is hereinafter referred to as the first DIW supply mechanism 70*c*. The first DIW supply mechanism 70*c* is connected to a first DIW supply source 71*c* via a line 74*c* which is provided with, from the upstream, a variable throttle valve 72*c* and an open/close valve 73*c*.

The fourth fluid supply mechanism 70*d* is for supplying an inert gas such as N$_2$ gas and is hereinafter termed as the first N$_2$ gas supply mechanism 70*d*. The first N$_2$ gas supply mechanism 70*d* is connected to a first N$_2$ gas supply source 71*d* via a line 74*d* which is provided with, from the upstream, a variable throttle valve 72*d* and an open/close valve 73*d*.

The fifth fluid supply mechanism 70*e* is for supplying de-ionized water (DIW) as a rinsing liquid and is hereinafter referred to as the second DIW supply mechanism 70*e*. The second DIW supply mechanism 70*e* is connected to a second DIW supply source 71*e* via a line 74*e* which is provided with, from the upstream a variable throttle valve 72*e* and an open/close valve 73*e*.

The sixth fluid supply mechanism 70*f* is for supplying inert gas such as N$_2$ gas and is hereinafter referred to as the second N$_2$ gas supply mechanism 70*f*. The second N$_2$ gas supply mechanism 70*f* is connected to a second N$_2$ gas supply source 71*f* via a line 74*f* which is provided with, from the upstream, a variable throttle valve 72*f* and an open/close valve 73*f*.

The sulfuric acid supply source 71*a*, for instance, may be constructed from a tank equipped with a heater and a device for delivering heated sulfuric acid from the tank. Since the hydrogen peroxide solution is supplied at an ordinary temperature, the hydrogen peroxide solution supply source 71*b* may be constructed from a tank and a device for delivering the hydrogen peroxide solution at an ordinary temperature from the tank.

Figure 9:
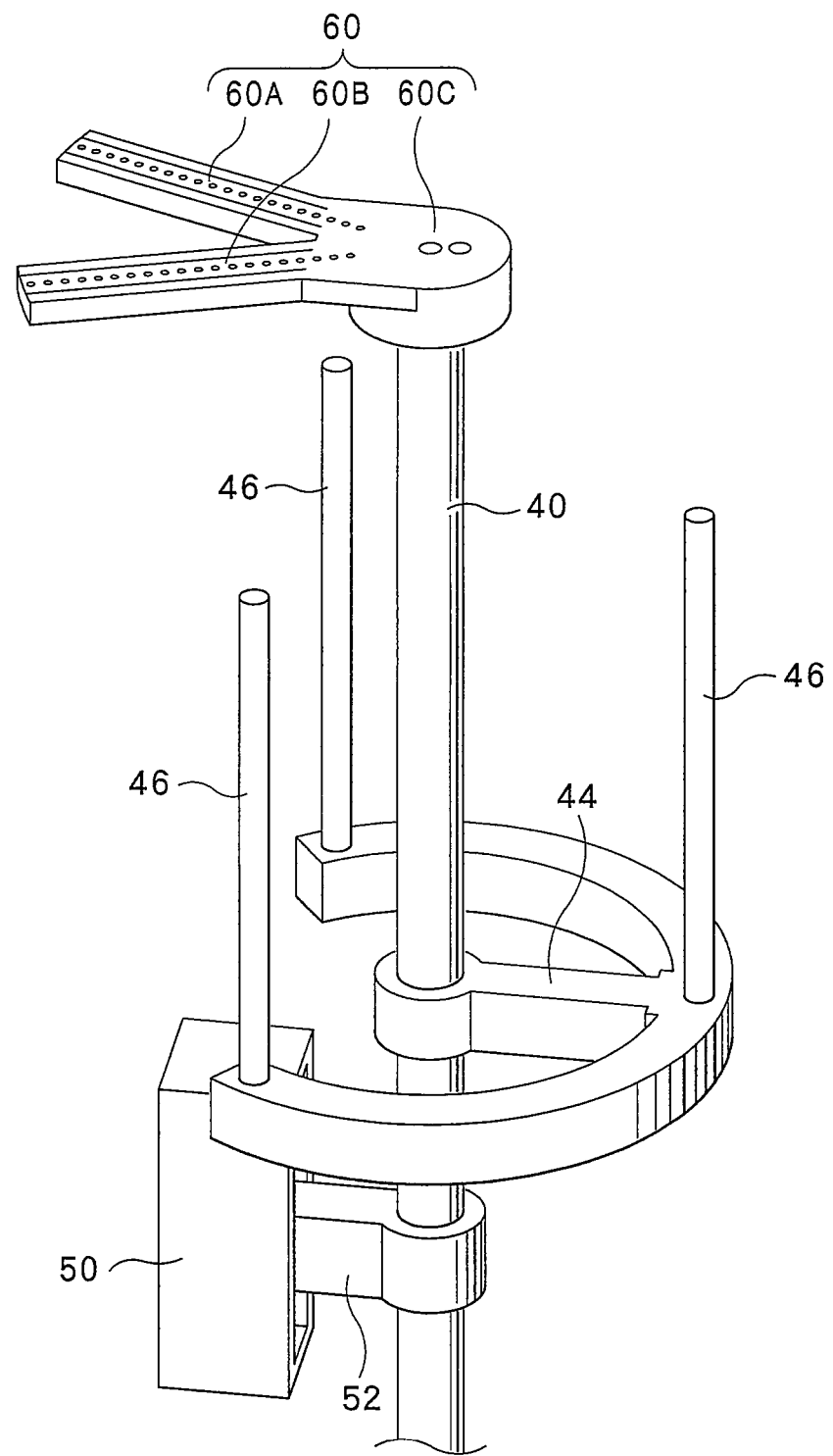
FIG. 9 is a perspective view showing the configuration of a treatment fluid supply pipe and bar-shaped nozzle in the substrate cleaning apparatus shown in FIGS. 2A and 2B, and the configuration of a lifting mechanism for vertically moving them.

As shown in FIGS. 2A, 2B, and 9, the vertical driving unit 50 is connected with the treatment fluid supply pipe 40 via a connecting member 52. The vertical driving unit 50 is configured to move the treatment fluid supply pipe 40 vertically. That is, by raising/lowering the connecting member 52, the vertical driving unit 50 moves the treatment fluid supply pipe 40 and bar-shaped nozzle 60 connected to the connecting member 52. More specifically, the vertical driving unit 50 raises/lowers the treatment fluid supply pipe 40 and the bar-shaped nozzle 60 between their lowered positions as in FIG. 2A and their raised positions as in FIG. 2B.

As shown in FIG. 9, the treatment fluid supply pipe 40 is further attached with a first interlocking member 44. Three rod-shaped second interlocking members 46 are connected to the first interlocking member 44 to extend upward therefrom. The second interlocking members 46 are arranged to correspond to the connecting members 24 extending downward from the lift pin plate 20. The outer diameter of the second interlocking member 46 is smaller than the inner diameter of the cylindrical accommodation member 32. That is to say, each second interlocking member 46 is arranged to contact the bottom of one connecting member 24 so that the second interlocking member 46 can push the connecting member 24 upward within the accommodation member 32, as shown in FIG. 2B.

Accordingly, when the vertical driving unit 50 moves the treatment fluid supply pipe 40 upward from the state shown in FIG. 2A, the first interlocking member 44 and second interlocking members 46 joined with the treatment fluid supply pipe 40 also moves upward so that the second interlocking members 46 push the connecting members 24 upward inside the accommodation members 32, whereby the lift pin plate 20 moves integrally with the treatment fluid supply pipe 40 so that the lift pin plate 20, the treatment fluid supply pipe 40, and the bar-shaped nozzle 60 thus reach their raised positions as in FIG. 2B. On the other hand, when the vertical driving unit 50 moves the treatment fluid supply pipe 40 downward from the state shown in FIG. 2B, since the spring 26 set within the accommodation member 32 constantly applies a downward force to the connecting member 24, the connecting member 24 descends downward integrally with the interlocking member 46 with its bottom being in contact with the top of the second interlocking member 46. The lift pin plate 20, the treatment fluid supply pipe 40, and the bar-shaped nozzle 60 thus reach their respective lowered positions as in FIG. 2A.

The lift pin plate 20 adjoins the retaining plate 30 when the lift pin plate 20 is positioned at its lowered position, as shown in FIG. 2A. In the illustrated embodiment, the lift pin plate 20 is rested on and supported by the retaining plate 30. On the other hand, the lift pin plate 20 is separated from the retaining plate 30 when the lift pin plate 20 is positioned at its raised position, as shown in FIG. 2B. The wafer W is then supported by the lift pins 22 and can be removed therefrom.

As mentioned above, the liquid treatment apparatus includes an interlocking mechanism having the first interlocking member 44 and the three second interlocking members 46 for integrally raising and lowering the lift pin plate 20, the treatment fluid supply pipe 40, and the bar-shaped nozzle 60. The liquid treatment apparatus also includes a lifting mechanism for integrally raising and lowering the lift pin plate 20, the treatment fluid supply pipe 40, and the bar-shaped nozzle 60 relative to the retaining plate 30 by employing the first interlocking member 44, the three second interlocking members 46, the vertical driving unit 50 and the connecting member 52.

Next, the configuration of the V-shaped nozzle 60 is described with reference to FIGS. 2A, 2B, 9, and 10A and 10B. The V-shaped nozzle 60 has a first bar-shaped portion 60A, a second bar-shaped portion 60B, and a central portion 60C. The first bar-shaped portion 60A and the second bar-shaped portion 60B are each connected to the central portion 60C in an arrangement such that the two form a V-shaped figure. The first bar-shaped portion 60A extends from a position opposing to a peripheral portion of the wafer W towards a position opposing to the central portion of the wafer W. Similarly, the second bar-shaped portion 60B extends from a position opposing to a peripheral portion of the wafer W towards a position opposing to the central portion of the wafer W. The V-shaped nozzle 60 is attached on the upper end of the treatment fluid supply pipe 40 at its central portion 60C. The central portion 60C also serves as a cover member for covering the through-hole 20a in the lift pin plate 20. The bar-shaped portions 60A and 60B extend from the central portion 60C radially outward of the lift pin plate 20, that is, radially outward of the wafer W, and terminate just short of an imaginary circumference on which the lift pins 22 are arranged. This ensures that the bar-shaped portions 60A, 60B would not interfere with the lift pins 22 during treatment (during treatment, the V-shaped nozzle 60 does not rotate while the lift pin plate 20 rotates).

Figure 10A:
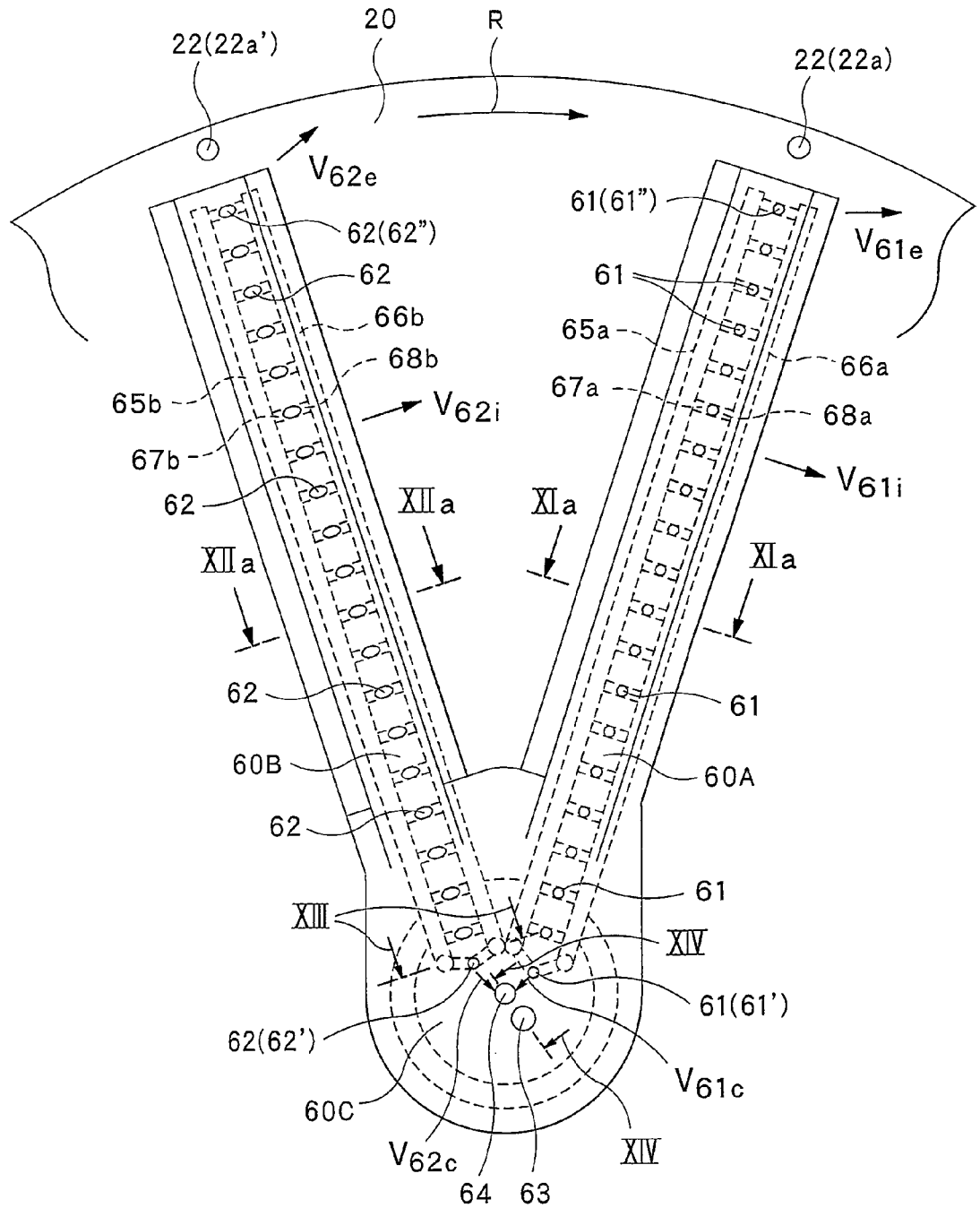
FIG. 10A is a plan view showing the V-shaped nozzle.

In the embodiment of FIG. 10A, the first bar-shaped portion 60A and the second bar-shaped portion 60B form an angle of 30 degrees, for example (not limited to this angle). Therefore, by setting the lift pin plate 20 and the retaining plate 30 at certain angular positions, the lift pins 22a, 22a' can be set in positions at which extended lines of the first and the second bar-shaped portion 60A, 60B respectively meet with the lift pins 22a, 22a'. A clearance between the lower wafer W surface and the V-shaped nozzle 60 is very narrow as can be seen in FIG. 2B. In terms of avoiding collision between the transport arm 104 and the V-shaped nozzle 60, it is thus preferable that the transport arm 104 and the V-shaped nozzle 60 do not overlap in a top plan view during wafer loading/unloading. If the lift pins 22a, 22a' and the first and second bar-shaped portion 60A, 60B are in a positional relationship as shown in FIG. 10A, the transport arm 104 can be easily inserted under the wafer without contacting the four lift pins nor the V-shaped nozzle 60 as in FIG. 10B. When the transport arm 104 is inserted under the wafer, the two distal end of the arm 104 pass through outside of the lift pins 22a, 22a' and inside the lift pins 22b, 22b'. The above is one advantage obtained by arranging the first bar-shaped portion 60A and the second bar-shaped portion 60B into the V-shaped configuration.

As shown in FIGS. 11(a) and 12(a), the first bar-shaped portion 60A and the second bar-shaped portion 60B have a cross-sectional shape resembling an airfoil. In the illustrated liquid treatment apparatus, the wafer W rotates in a direction of the arrow R in FIGS. 11(a), 12(a) with respect to the bar-shaped portions 60A and 60B. This rotation generates an airflow in the direction of the arrow R between the lower wafer W surface and the lift pin plate 20. The airflow passes though the space above the bar-shaped portions 60A, 60B with the cross section of an airfoil to improve the flow of the liquid. More specifically, as the airflow passes through the space between the rear of the bar-shaped portions 60A, 60B and the wafer W, the airflow is narrowed down. The airflow will be accelerated and also rectified to a direction towards the lower wafer W surface. Such airflow assists the treatment liquid (e.g., a chemical liquid) collided with the lower wafer W surface to spread more smoothly over the surface. In addition, since the bar-shaped portion 60A has the cross section like an airfoil, vibration of the bar-shaped portion 60A due to the airstream can be suppressed to a minimum.

The V-shaped nozzle 60 includes a plurality of first ejection ports 61 arranged between a position opposing to a central portion of the wafer W and a position opposing to a peripheral portion of the wafer W. The first ejection ports 61 are for ejecting high-temperature SPM (a mixture of sulfuric acid and a hydrogen peroxide solution) towards the wafer W. The first ejection ports 61 are arranged in a row in a longitudinal direction of the first bar-shaped portion 60A from the central portion 60C to the distal end of the first bar-shaped portion 60A. The V-shaped nozzle 60 also includes a plurality of second ejection ports 62 arranged between a position opposing to a central portion of the wafer W and a position opposing to a peripheral portion of the wafer W. The second ejection ports 62 are for ejecting a mist of a fluid mixture of DIW (deionized water) and $N_2$ gas or only DIW towards the wafer W. The second ejection ports 62 are arranged in a row in a longitudinal direction of the second bar-shaped portion 60B from the central portion 60C to a distal end of the second bar-shaped portion 60B. In addition, the V-shaped nozzle 60 includes a third ejection port 63 in the central portion 60C. The third ejection port 63 is for ejecting DIW towards the central portion of the wafer W. The V-shaped nozzle 60 further includes a fourth ejection port 64 in the central portion 60C. The fourth ejection port 64 is for ejecting $N_2$ gas towards the central portion of the wafer W. The fourth ejection port 64 is positioned almost directly below the center of the wafer W retained by the retaining plate 30.

Diameters of the first and second ejection ports 61, 62 and those of the ejecting passages 67a, 67b, 68a, 68b connected to the ejection ports 61, 62 are small (about 0.3 to 0.5 mm). Therefore the liquid becomes electrically charged due to friction caused by the liquid passing through the ejection ports and the ejecting passages. This may be prevented by forming the V-shaped nozzle 60 from an electrically conductive material such as PFA containing carbon fibers.

Figure 14:
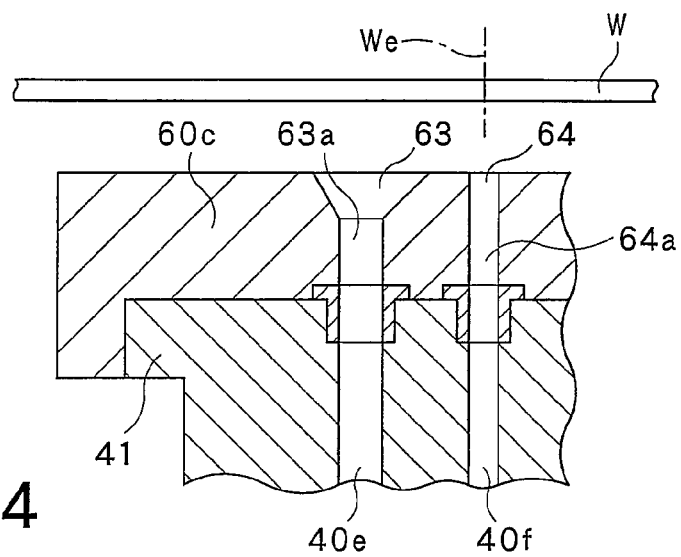
FIG. 14 is a cross-sectional view taken along line XIV-XIV in FIG. 10A to show the structure of the central portion of the V-shaped nozzle.

As shown in FIG. 14, the treatment fluid supply pipe 40 has, at its upper end, a head 41 of an enlarged diameter. The central portion 60C of the V-shaped nozzle 60 is coupled to the head 41 of the treatment fluid supply pipe 40 by a screw not shown.

As shown in FIG. 14, as the central portion 60C and the head 41 become coupled together, the second DIW supply passage 40e extending vertically inside the treatment fluid supply pipe 40 communicates with an ejecting passage 63a extending vertically inside the central portion 60C. The DIW can thus be fed via the second DIW supply passage 40e to the third ejection port 63 and ejected towards the lower surface of the wafer W. The third ejection port 63 has a shape that ensures the DIW ejected therefrom to reach the wafer center Wc on the lower wafer W surface. The second $N_2$ gas supply passage 40f extending vertically inside the treatment fluid supply pipe 40 and an ejecting passage 64a extending vertically inside the central portion 60C are also communicated with each other as the central portion 60C is coupled to the head 41. The $N_2$ gas can thus be supplied via the second $N_2$ gas supply passage 40f to the fourth ejection port 64 and ejected towards the lower surface of the wafer W.

Figure 13:
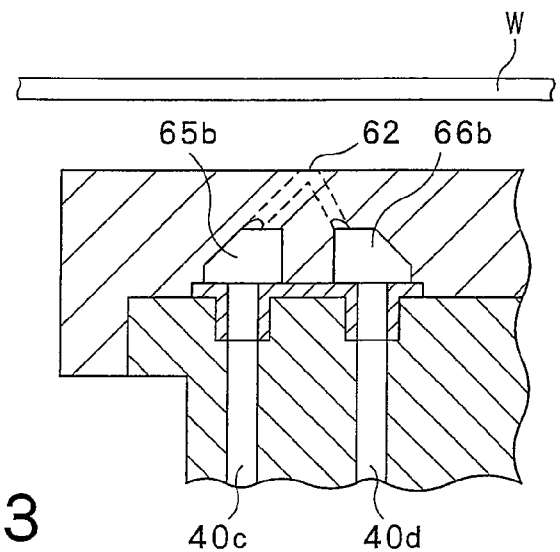
FIG. 13 is a cross-sectional view taken along line XIII-XIII in FIG. 10A showing the structure of a central portion of the V-shaped nozzle.

In addition, when the central portion 60C is coupled to the head 41, the first DIW supply passage 40c extending vertically inside the treatment fluid supply pipe 40 communicates with a fluid passageway (DIW passageway) 65b formed in the V-shaped nozzle 60, and the first $N_2$ gas supply passage 40d extending vertically inside the treatment fluid supply pipe 40 communicates with a fluid passageway ($N_2$ gas passageway) 66b formed in the V-shaped nozzle 60, as shown in FIG. 13. As indicated by dashed lines in FIG. 10A, the DIW passageway 65b and the $N_2$ gas passageway 66b are parallel to each other and extend horizontally from the central portion 60C of the V-shaped nozzle 60 to the distal end of the second bar-shaped portion 60B in the longitudinal direction. Although not illustrated in details, when the central portion 60C is coupled to the head 41, the sulfuric acid supply passage 40a extending vertically inside the treatment fluid supply pipe 40 also communicates with a fluid passageway (sulfuric acid passageway) 65*a* formed in the V-shaped nozzle 60, and the hydrogen peroxide solution supply passage 40*b* extending vertically inside the treatment fluid supply pipe 40 communicates with a fluid passageway (hydrogen peroxide solution passageway) 66*a* formed in the V-shaped nozzle 60. As indicated by dashed lines in FIG. 10A, the sulfuric acid passageway 65*a* and the hydrogen peroxide solution passageway 66*a* are parallel to each other and extend horizontally from the central portion 60C of the V-shaped nozzle 60 to the distal end of the second bar-shaped portion 60A in the longitudinal direction.

Figure 11:
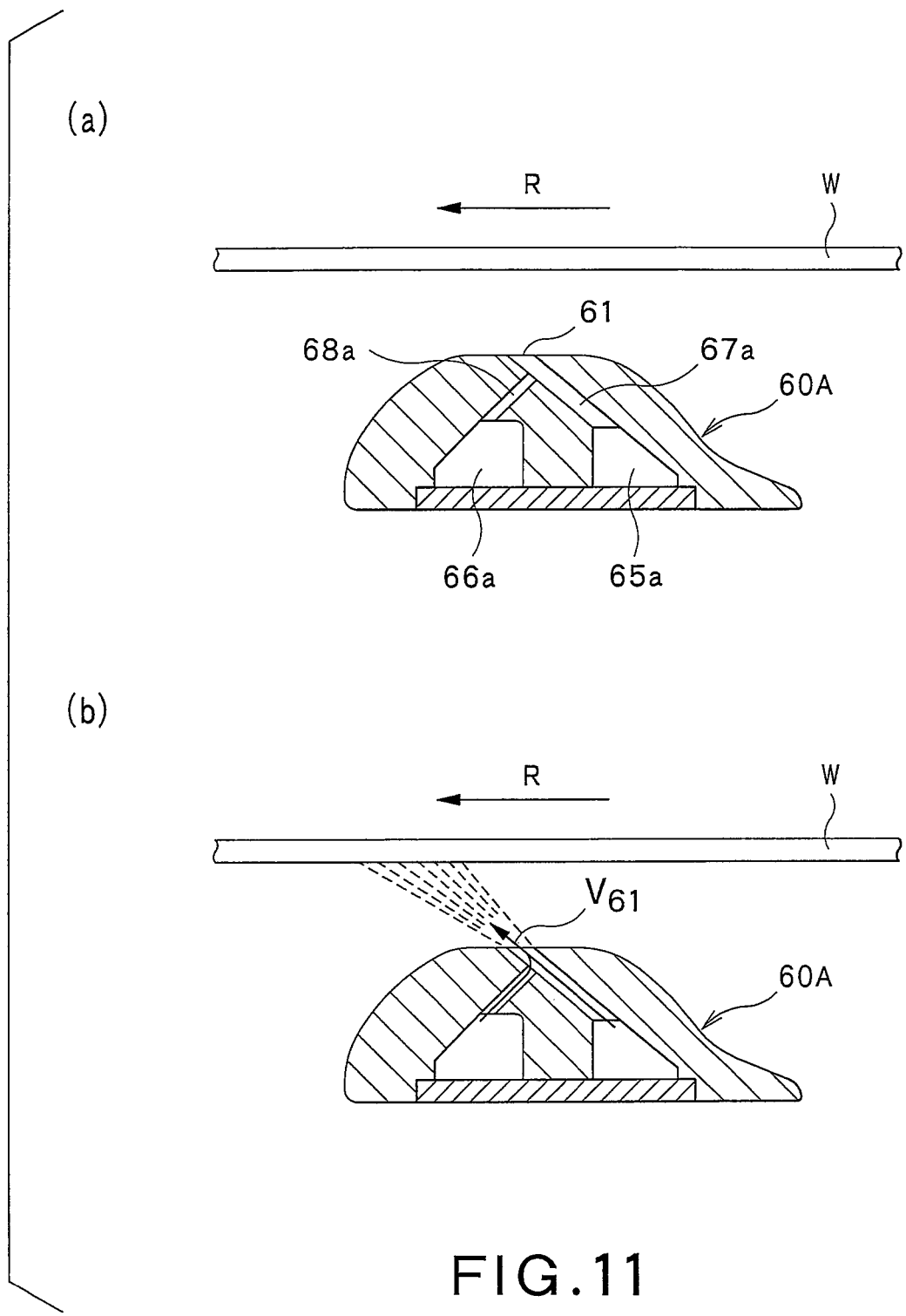
FIG. 11 is for explanation of the configuration and the function of a first bar-shaped portion of the V-shaped nozzle, wherein (a) is a cross-sectional view taken along line XIa-XIa in FIG. 10A showing the internal structure of the first bar-shaped portion, and (b) is a schematic view showing the condition of SPM ejected out from the first bar-shaped portion.

As shown in FIG. 11(*a*), in the central portion 60C and in the first bar-shaped portion 60A of the V-shaped nozzle 60, one ejection port 61 is connected with one sulfuric acid ejecting passage 67*a* and one hydrogen peroxide solution ejecting passage 68*a* which are each connected to the sulfuric acid passageway 65*a* and the hydrogen peroxide solution passageway 66*a*, respectively. The hydrogen peroxide solution ejecting passage 68*a* meets the sulfuric acid ejecting passage 67*a* at a position before the ejection port 61 where the sulfuric acid ejecting passage 67*a* ends. Thus, a fluid mixture of sulfuric acid and a hydrogen peroxide solution, that is, the SPM is ejected from each ejection port 61. As shown in FIG. 11(*b*), each ejection port 61 is preferably configured to eject the SPM in a direction inclined to the rotating direction R of the wafer W. In other words, it is preferable that a vector V61 representing the direction in which the SPM is ejected has a component of the rotating direction R of the wafer W. This suppresses bouncing (splash-back) of the SPM upon its collision with the lower wafer W surface and in turn reduces waste and increases effectiveness of SPM usage. Since the vector indicating the ejecting direction of the SPM has the component of the rotating direction of the wafer W, the ejected SPM is less likely to drop from the wafer W onto the V-shaped nozzle 60. This is because the SPM tends to drop from the wafer W at the instant and immediately after the SPM has reached the wafer W. The fact that the vector representing the ejecting direction of the SPM has the component of the rotating direction of the wafer W (in other words, the SPM is ejected in a direction away from the second bar-shaped portion 60B) is also advantageous in that undesirable adhesion of the SPM onto the second bar-shaped portion 60B can be prevented or suppressed. Incidentally, most of the ejection ports 61 are preferred to be formed so that the vector V61 indicating the ejecting direction of the SPM from the ejection ports 61 has the component of the wafer rotational direction and the vector V61 is oriented in a direction orthogonal to the longitudinal direction of the first bar-shaped portion 60A. On the other hand, one radially outermost ejection port 61" or some ejection ports 61 including the port 61" may instead be configured to eject SPM in a direction such that the vector V61 representing the ejecting direction has a component of a radially outward direction as the arrow V61*e* in FIG. 10A. Used SPM can then be swept away from the wafer W smoothly. In addition, one radially innermost ejection port 61' or some ejection ports 61 including the port 61' may be formed to eject SPM in a direction such that a vector V61 representing the ejecting direction is oriented radially inward as shown by the arrow V61*c* in FIG. 10A. This ensures that there is no non-treated region in the central portion of the wafer W.

Figure 12:
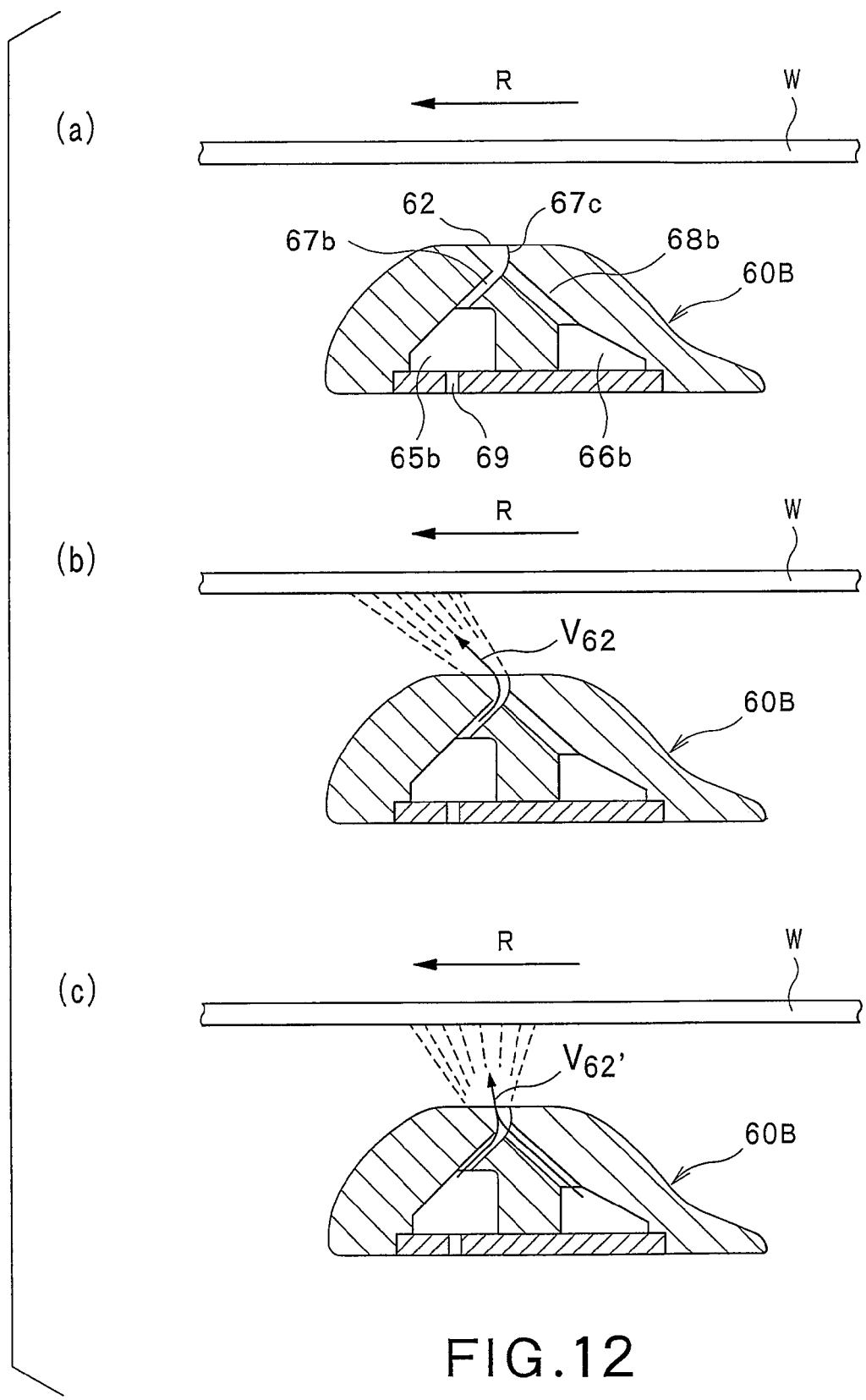
FIG. 12 is for explanation of the configuration and the function of a second bar-shaped portion of the V-shaped nozzle, wherein (a) is a cross-sectional view taken along line XIIa-XIIa in FIG. 10A showing the internal structure of the second bar-shaped portion, (b) is a schematic view showing the condition of DIW ejected out from the second bar-shaped portion, and (c) is a schematic view showing the condition of a mist of a fluid mixture of DIW and $N_2$ gas ejected from the second bar-shaped portion.

As shown in FIG. 12(*a*), at the central portion 60C and second bar-shaped portion 60B of the V-shaped nozzle 60, each ejection port 62 is connected with one DIW ejecting passage 67*b* and one $N_2$ gas ejecting passage 68*b* which are each communicated with the DIW passageway 65*b* and the $N_2$ gas passageway 66*b*, respectively. The DIW ejecting passage 67*b* includes a curved deflection face 67*c* near the ejection port 62 where the DIW ejecting passage 67*b* terminates. The $N_2$ gas ejecting passage 68*b* meets the DIW ejecting passage 67*b* in the vicinity of the lower end of the deflection face 67*c*. When DIW is supplied from the DIW passageway 65*b* via the DIW ejecting passage 67*b* while $N_2$ gas is not supplied or slightly supplied, the DIW will be curved by the deflection face 67*c*. The DIW will be ejected from the ejection port 62 as shown in FIG. 12(*b*), in a direction inclined to the rotational direction R of the wafer W. In other words, a vector V62 indicating the direction in which the DIW is ejected from each ejection port 61 has a component of the rotational direction R of the wafer W.

Next, when both the $N_2$ gas and the DIW are supplied from the $N_2$ gas passageway 66*b* via the $N_2$ gas ejecting passage 68*b* and from the DIW passageway 65*b* via the DIW ejecting passage 67*b*, the DIW flow and the $N_2$ gas flow collides at the junction of the DIW ejecting passage 67*b* and the $N_2$ gas ejecting passage 68*b*. The two fluids will be mixed to form a mist (droplets) of a mixture of the DIW and the $N_2$ gas. Since the DIW is mixed with the $N_2$ gas before reaching the deflection face 67*c*, the direction of ejection is slightly affected by the deflection lace 67*c*. The mist will be ejected upward from the ejection port 62 while spreading in a fan-like form as in FIG. 12(*c*). A vector V62' representing the ejecting direction (major direction) of the mist substantially is oriented to the upright direction and has a small component of the wafer rotational direction R (i.e., the angle between the ejecting direction and the lower wafer W surface is large). However, this is preferable in this case because the cleaning effect of the mist relies on the collision energy of the mist. It is also preferable if the vector V62' representing the ejecting direction (major direction) of the mist has a component of a direction opposite to the rotational direction R of the wafer. Similarly to the case of the SPM ejection, one radially outermost ejection port 62" or some ejection ports 62 including the port 62" are configured to eject DIW or the mist in a direction such that a vector V62 (V62') representing the ejecting direction has a component of a radially outward direction as shown by arrow V62*e* in FIG. 10A. Further, one radially innermost ejection port 62' or some ejection ports 62 including the port 62' are preferred to be formed to eject DIW or the mist in a direction such that a vector V62 representing the ejecting direction is oriented radially inward as shown by arrow V62*c* in FIG. 10A. As previously mentioned, since cleaning with the mist is done by applying the wafer W the collision energy of the mist, it is especially desirable that the ejection ports 62 is configured such that all area of the wafer W surface to be treated (the whole lower surface) is directly beaten with the mist.

The bottom wall of the V-shaped nozzle 60 which is also the bottom wall of the DIW passageway 65*b* is provided with a plurality of DIW ejection ports 69 as shown in FIG. 12(*a*). The DIW ejection ports 69 are disposed over an entire length of the DIW passageway 65*b* at predetermined intervals. These DIW ejection ports 69 are used to eject DIW as an apparatus cleaning liquid. The DIW is ejected from each DIW ejection port 69 to the surface of the lift pin plate 20, flows towards the outside due to centrifugal force and subsequently scatters outward from the lift pin plate 20. This flow of DIW washes away undesired substances such as SPM and reaction products of SPM and the resist film, whereby cleaning the surface of the lift pin plate 20. There may be another DIW passageway formed inside the V-shaped nozzle 60 independently of the DIW passageway 65*b* to supply DIW from the DIW ejection ports 69.

Figure 15:
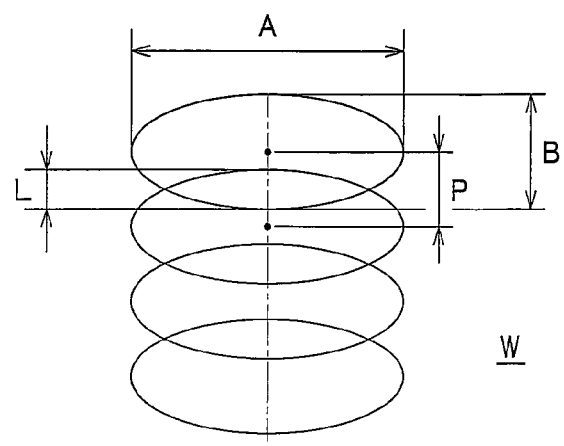
FIG. 15 is a schematic plan view showing spots on the lower wafer surface formed by a treatment fluid ejected from the V-shaped nozzle.

The plurality of ellipses in FIG. 15 each represent an area where an ejected treatment fluid (SPM, DIW) covers on the lower surface of the wafer W at the instant of reaching the surface (this area is hereinafter also referred to as "spot"). After reaching the lower surface of the wafer W, the treatment fluid ejected from the ejection port 61 or 62 spreads on the surface due to factors such as a centrifugal force of the wafer W rotation and the pressure of jetting from the ejection port 61, 62. Since the treatment fluids are ejected out obliquely upward from the ejection ports 61 and 62, the shapes of the spots are elliptical. On the other hand, the two-fluid spray forms a circular spot having a relatively large diameter. The pitch P between the centers of elliptical spots is equivalent to an arrangement pitch of the ejection ports 61 and 62. Since an ejected treatment fluid diffuses before reaching the wafer, a minor axis of each ellipse has a length B greater than a diameter of the ejection port 61 or 62. Length A of a major axis of the ellipse is much greater than the diameter of the ejection port 61. Since the energy of collision between the two-fluid spray and the wafer W is an important factor for two-fluid spray jetting, the ejection ports 61, 62 are thus preferred to be designed so that adjacent spots have an overlapped portion having a length of L therebetween. In the case of ejecting a chemical liquid such as SPM, it is also preferable to configure the ejection ports 61, 62 in such a way that adjacent spots have an overlapped portion of a length L for the sake of achieving uniform treatment. However, if the chemical liquids forming adjacent spots are to merge immediately, the adjacent spots need not overlap with each other.

Figure 10B:
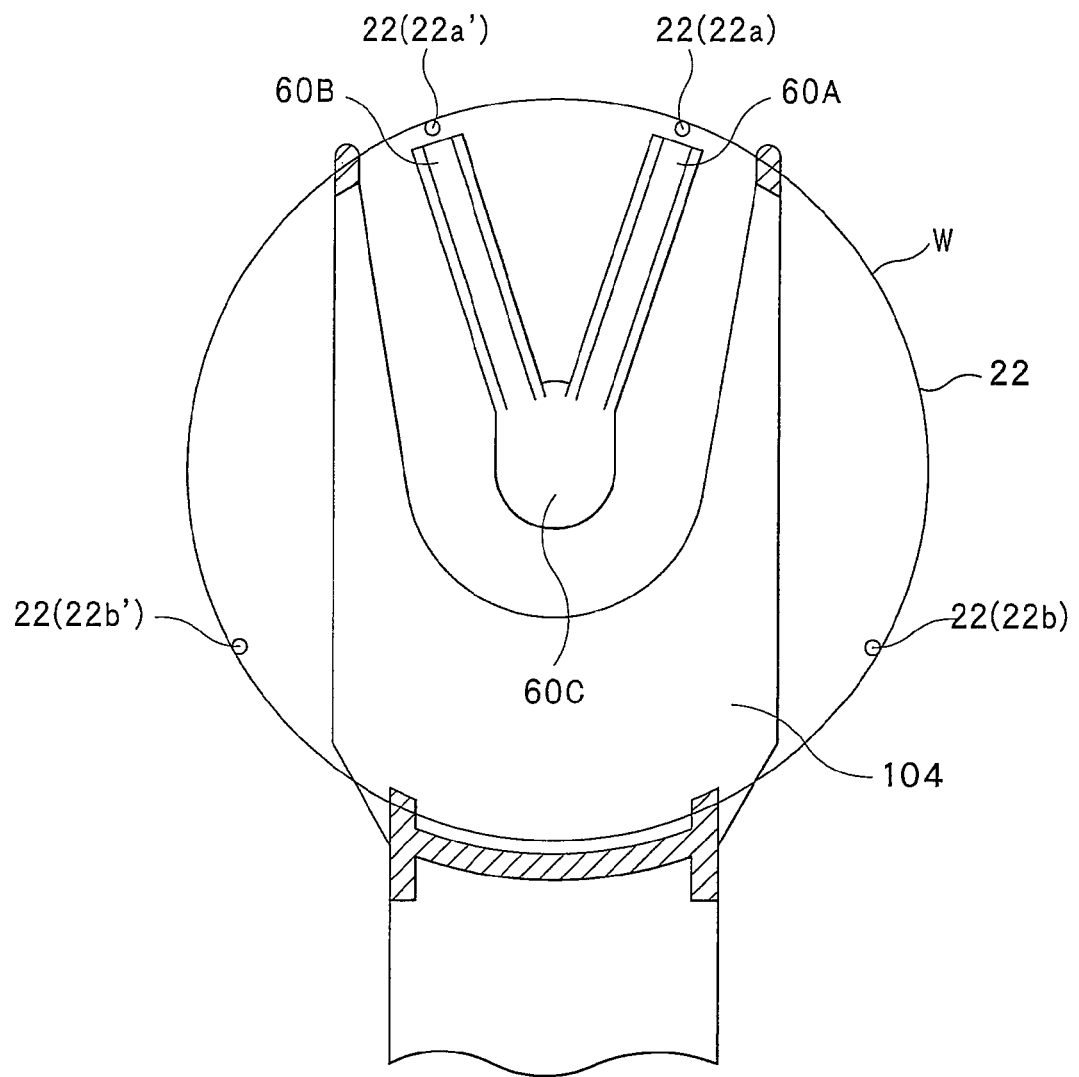
FIG. 10B is a schematic plan view illustrating a positional relationship between the V-shaped nozzle, lift pins, and a transport arm at a time when the wafer is transferred between the lift pin plate and the transport arm.

As shown in FIGS. 10A and 10B, the V-shaped nozzle 60 includes the first bar-shaped portion 60A and second bar-shaped portion 60B arranged in a V-shaped figure. The first bar-shaped portion 60A having the ejection ports 61 for jetting SPM is arranged at a position advanced or rotated through an acute angle (30 degrees in the illustrated embodiment) in the rotational direction R of the wafer W from the second bar-shaped portion 60B for ejecting DIW or the two-fluid spray including DIW. This layout is advantageous in terms of maintaining the V-shaped nozzle 60 clean. There is an airflow traveling in the wafer rotation direction R under the lower surface of the wafer W, with which the liquids ejected from the ejection ports 61 and 62 flows. Part of the liquids ejected from the ejection ports 61, 62 and reach the wafer W will drop therefrom due to gravity. If the positions of the first bar-shaped portion 60A and second bar-shaped portion 60B were reversed from those shown in FIG. 10A, the SPM ejected from the first bar-shaped portion 60A and reaction products are more likely to adhere to the second bar-shaped portion 60B for ejecting DIW or the two-fluid spray. This is unfavorable hence the SPM and reaction products contaminate the rinsing fluid supplied from the second bar-shaped portion 60B. On the other hand, if the first bar-shaped portion 60A and the second bar-shaped portion 60B are arranged as shown in FIG. 10A, the first bar-shaped portion 60A can be cleaned by the DIW or DIW-containing two-fluid spray ejected from the second bar-shaped portion 60B. Thus, it is desirable to arrange the first bar-shaped portion 60A at a position advanced through a small angle (30 degrees in the illustrated embodiment) in the wafer rotational direction R from the second bar-shaped portion 60B. In other words, the second bar-shaped portion 60B is desired to be arranged at a position advanced through a large angle (330 degrees in the illustrated embodiment) in the wafer rotational direction R from the first bar-shaped portion 60A.

The substrate cleaning apparatus 10 includes a controller 100 that controls the whole operation of the apparatus. The controller 100 controls operation of all functional components of the substrate cleaning apparatus 10 (e.g., the rotational driving unit 39, the vertical driving unit 50, the first to sixth fluid supply mechanisms 70a to 70f, and a power supply for a LED lamp 83 described later, etc.). The controller 100 can be implemented with hardware such as a general-purpose computer, and a program as software for controlling the computer (apparatus control program, processing recipe, etc.). The software may be stored in a hard-disk drive or other storage medium fixedly provided in the computer, or may be stored in a storage medium removably set in the computer such as a CD-ROM, DVD, flash memory. Such a storage medium is denoted with reference number 106. Upon receipt of instructions from a user interface (not shown), a processor 107 calls up a required processing recipe from the storage medium 106 and executes the recipe. The controller 100 thereby controls and operates the functional components of the substrate cleaning apparatus 10 to perform a predetermined process (treatment). Alternatively, the controller 100 may be a system controller that controls the whole operations of the liquid treatment system shown in FIG. 1.

Next, the cover member 80 will be described. As shown in FIG. 2A, the cover member 80 includes a disk-like main body 81 having a diameter at least greater than that of the wafer W. The disk-like main body 81 preferably has a shape and dimensions sufficient to completely cover the upper opening of the rotational cup 36, and further preferably has a shape and dimensions sufficient to completely cover the upper opening of the outer cup 56. The cover member 80 in the illustrated embodiment is formed in a disk-like shape having a diameter somewhat greater than that of the upper opening of the outer cup 56. A hole 87, vertically passing through the cover member 80, is formed in the central portion of the cover member 80.

As schematically shown in FIG. 2A, the cover member 80 incorporates LED lamps 83 for heating the wafer W. The illustrated embodiment employs a LED lamp array including the plurality of LED lamps 83. The LED lamp 83 employed here is one that radiates light of a wavelength suitable for heating the wafer W, for example, a wavelength of 880 nm. The LED lamp 83 is covered and protected by a cover 84 made from quartz, which transmits the light of wavelength 880-nm and has high corrosion-resistant. Although FIG. 2A presents a case where one LED lamp array with a size generally equal to that of the wafer W is provided, the present invention is not limited to this. An example of an alternative configuration is such that has one or a plurality of LED lamp arrays provided at a position opposing to the central portion of the wafer, one or a plurality of LED lamp arrays provided at a position opposing to the peripheral portion of the wafer, and one or a plurality of LED lamp arrays provided at a position opposing to an intermediate portion of the wafer, that is, the portion between the wafer center and the wafer periphery. In this configuration, the temperature of the wafer W can be controlled differently area-by-area (i.e., so-called zone control) by controlling each LED lamp array independently. Incidentally, the outer circumferential portion of the wafer W is likely to be cooled by the airflow caused by the rotation of the wafer W. With regard of this, it is preferable to increase the output power of the LEDs or the number thereof (the number of light-emitters) as approaching closer to the wafer edge in order to heat the wafer W uniformly.

The main body 81 comprises therein above the LED lamp 83 a cooling medium passageway 82a to cool and protect the LED lamp 83 that are heat-sensitive. The cooling medium passageway 82a may be configured in a helical or concentric form or other forms in a plane view. The cooling medium passageway 82a is connected to a cooling medium supply source 82e (CM) (e.g., cooling water supply source) via a cooling medium supply tube 82b. The cooling medium supply tube 82b is equipped with, from the upstream, a variable throttle valve 82d and an open/close valve 82c. The cooling medium passageway 82a is also connected with a cooling medium discharging tube (not shown) to discharge cooling medium that has been heated through heat exchange. A power unit 85b supplies electric power to the LED lamp 83 via a cable 85a.

A vertical driving mechanism 86 for moving the cover member 80 vertically is provided to the apparatus. By driving the vertical driving mechanism 86, the cover member 80 can move between a "treating position" and a "stand-by position". The "treating position" is a position near and above the wafer W proximate to and directly above the wafer W. The "stand-by position" is a position further above the wafer W indicated by double-dashed line in FIG. 2B and far enough from the wafer W so that the cover member 80 does not obstruct the loading/unloading of the wafer W. The vertical driving mechanism 86 includes an arm 86a jointed to the center of the upper surface of the cover member 80 and an air cylinder 86b having its upper end of cylinder rod connected to the arm 86a.

Next, a series of process steps of a cleaning treatment (process) performed by the substrate cleaning apparatus 10 for removing undesired resist films from a wafer surface will be described.

<Wafer Loading and Placing Step>

First, the vertical driving mechanism 86 moves the lift pin plate 20, the treatment fluid supply pipe 40, and the V-shaped nozzle 60, to their respective upper positions shown in FIG. 2B. Next, as indicated by double-dashed lines in FIG. 2B, a wafer W is carried in from the outside of the substrate cleaning apparatus 10 by the transport arm 104 and the wafer W is rested onto the lift pins 22 of the lift pin plate 20. The vertical driving unit 50 then moves the treatment fluid supply pipe 40 and the V-shaped nozzle 60 from the upper positions to the lower positions. At this time, since the spring 26 disposed inside the accommodation member 32 constantly exerts a downward force upon the connecting member 24, the lift pin plate 20 also moves from the upper position to the lower position together with the treatment fluid supply pipe 40. The lower surface of the lift pin plate 20 pushes down the pressure-receiving member 31c of the substrate retaining member 31 from the state of FIG. 6. The substrate retaining member 31 in turn rotates around the axle 31a in the counterclockwise direction of FIG. 6 to move the substrate retaining portion 31b towards the wafer W from its lateral side as shown in FIG. 7, whereby the substrate retaining member 31 and the fixed retaining member 37 hold the wafer W from its lateral side as shown in FIG. 8. The retained wafer W is then lifted upward to leave the lift pin 22. Before the wafer W is carried into the substrate cleaning apparatus 10, the wafer W is reversed by a reverser 105 (see FIG. 1) so that its "front surface" (the surface on which patterns are to be formed) comes to the "lower surface" and its "back surface" (the surface on which no patterns are to be formed) comes to the "upper surface". The wafer W is retained in this state by the retaining plate 30. In the present description, the term "upper surface" (or "lower surface") simply means a face that is facing upward (downward) at a particular point in time.

<SPM Cleaning Step>

Next as shown in FIG. 2A, the cover member 80 held upwards at the stand-by position is lowered to the treating position near the wafer W to shroud the upside of the wafer W. Then, the rotational driving unit 39 is actuated to rotate the retaining plate 30. At this time, the connecting members 24 extending downward from the lower surface of the lift pin plate 20 are accommodated in the accommodation members 32 extending downward from the lower surface of the retaining plate 30. The lift pin plate 20 thus rotates together with the retaining plate 30 to rotate the wafer W as well. During the rotation, the treatment fluid supply pipe 40 and the V-shaped nozzle 60 attached thereto remain still and do not rotate. Simultaneously with or after the start of wafer rotation, the LED lamp 83 inside the cover member 80 is energized to heat the wafer W from its back surface (i.e., a surface on which no device is formed) which is the upper surface of the wafer W. The wafer W may be heated to about 200° C. for example. After the wafer W reaches a predetermined temperature, sulfuric acid heated to about 150° C. is supplied from the sulfuric acid supply mechanism 70a to the sulfuric acid supply passage 40a, and also a hydrogen peroxide solution at an ordinary temperature is supplied from the hydrogen peroxide solution supply mechanism 70b to the hydrogen peroxide solution supply passage 40b. The supplied sulfuric acid and hydrogen peroxide solution are mixed at a position just before the ejection port 61 as shown in FIG. 11(b) to be ejected as SPM towards the lower surface of the wafer W. The mixing of the sulfuric acid and hydrogen peroxide solution causes the mixture thereof to rise in temperature due to reaction heat. The temperature of the SPM ejected from the ejection port 61 is nearly 180° C. Resist films on the wafer W is lifted off (peeled off) by the ejected SPM. As the SPM having a temperature lower than that of the wafer W is ejected upon the wafer W, the temperature of the wafer W would decrease. The SPM is thus preferable to be ejected intermittently. The removed resist films and reaction products flow together with the SPM radially outward along the lower surface of the wafer W due to the centrifugal force, flow outside of the wafer W, are received by the rotational cup 36 to change its flowing direction downward, and are discharged from a waste liquid tube 58 connected to the bottom of the outer cup 56. At this time, fumes are generated in the space below the wafer W. The fumes do not diffuse into the chamber 12 above the wafer W because the cover member 80 covers the upside of the rotation cup 36, the outer cup 56, and the wafer W. The fumes are drawn into the waste liquid tube 58 connected to a factory exhaust line (at a slightly negative pressure) and are discharged with the waste SPM liquid. In the space between the upper surface of the wafer W and the lower surface of the cover member 80, an airflow (flow of a gas) F1 directed to the outside of the wafer W causes due to rotation of the wafer W (see FIG. 2A). The airflow F1 generates a negative pressure near the central portion of the wafer W. The hole 87 provided centrally in the cover member 80 functions as an air intake which brings clean air above the cover member 80 into the space between the wafer W and the cover member 80. The air that has been taken in flows in the direction of the airflow F1 and is deflected downward (see arrow F2) by the inner surface of the rotation cup 36, then discharged from the slightly depressurized waste liquid tube 58 provided at the bottom of the outer cup 56. The airflows indicated by the arrows F1 and F2 act as a shield to prevent the fumes around the lower surface of the wafer W from diffusing into a space higher than the wafer W. Thus, the diffusion of the fumes into the chamber 12 can be suppressed more effectively. Alternatively, a mechanism for supplying an inert gas such as $N_2$ gas may be connected to an upper end of the hole 87 to feed the $N_2$ gas into the space between the wafer W and the cover member 80 thereby forming gas flows like those shown by the arrows F1 and F2.

First Rinsing Step

After performing SPM cleaning for a predetermined time, the SPM ejection from the ejection port 61 as well as the wafer heating by the LED lamp 83 are stopped. While the wafer is kept rotating, the second DIW supply mechanism 70e feeds DIW to the second DIW supply passage 40e at a relatively high flow rate (e.g., 1,500 ml per minute). The DIM is then ejected towards the central portion of the wafer W from the ejection port 63 provided in the central portion 60C of the V-shaped nozzle 60. The DIW flows radially outward along the lower surface of the wafer W due to centrifugal force, flows out of the wafer W, is received by the rotation cup 36 to change its flowing direction downward, and is discharged from the waste liquid tube 58 connected at the bottom of the outer cup 56. Residues of SPM and resists on the lower surface of the wafer W are thus removed by the DIW flowing radially outward along the surface.

Mist Ejecting Step

After performing the first DIW rinsing process for a predetermined time, DIW ejection from the ejection port 63 is stopped. While the wafer is kept rotating, DIW is supplied at a flow rate of, for example, about 100 to 300 ml per minute from the first DIW supply mechanism 70c to the first DIW supply passage 40c and also $N_2$ gas is supplied from the first $N_2$ gas supply mechanism 70d to the first $N_2$ gas supply passage 40d. As shown in FIG. 12(c), the supplied DIW and $N_2$ gas are mixed at a position just before the ejection port 62 and then ejected towards the lower surface of the wafer W as a mist (droplets) of a fluid mixture of the diffused DIW and $N_2$ gas. Collision energy of the mist removes substances such as resist residues, particles, left on the lower surface of the wafer W. After the DIW sprayed as a mist reaches the lower surface of the wafer W, the DIW flows radially outward along the lower surface of the wafer W due to centrifugal force, flows out of the wafer W, is received by the rotation cup 36 to change its flowing direction downward, and is discharged from the waste liquid tube 58 connected at the bottom of the outer cup 56. The $N_2$ gas is also discharged from the waste liquid tube 58. The mist jetting process may be regarded as a rinsing process as well.

Second DIW Rinsing Step

After performing the mist ejecting step for a predetermined time, the mist ejection from the ejection port 62 is stopped. While the wafer W is kept rotating, second DIW rinsing is conducted in the same manner as the first DIW rinsing process.

$N_2$ Spin-Drying Step

After performing the second DIW rinsing step for a predetermined time, the DIW ejection from the ejection port 63 is stopped. While the wafer is kept rotating (the rotation speed is preferably increased), $N_2$ gas is supplied from the second $N_2$ gas supply mechanism 70f through the second $N_2$ gas supply passage 40f to the ejection port 64 which is provided in the central portion 60C of the V-shaped nozzle 60. The $N_2$ gas is then ejected towards the central portion of the wafer W, whereby the DIW remaining on the lower surface of the wafer W is spun off by the centrifugal force, and the $N_2$ gas promotes the drying.

Wafer Unloading Step

After $N_2$ spin-drying, wafer rotation is stopped and the cover member 80 is lifted up to return to the stand-by position. The vertical driving unit 50 moves the treatment fluid supply pipe 40 and the V-shaped nozzle 60 from the lower positions to the upper positions. At this time, each second interlocking member 46 pushes up one connecting member 24 so that the lift pin plate 20 moves upwards in association with the treatment fluid supply pipe 40 from the lower position to the upper position. The substrate retaining member 31 rotates about the axle 31a in the clockwise direction of FIG. 6 (the direction opposite to the arrow in FIG. 6) due to the bias force applied by the spring member 31d. The substrate retaining member 31 moves away laterally from the wafer W and the wafer W is then supported from its backside by the lift pins 22. After the lift pin plate 20, the treatment fluid supply pipe 40, and the V-shaped nozzle 60 have reached the respective upper positions as in FIG. 2B, the transport arm 104 carries away the wafer W from the lift pins 22. The wafer W is taken out or unloaded from the substrate cleaning apparatus 10 and is reversed upside down by the reverser 105. The cover member 80 may be set back to the stand-by position at any timing after the SPM cleaning step.

Of the ejecting passages 67a, 67b, 68a, 68b, the $N_2$ gas ejecting passage 68b is a passage that delivers gas. When the supply of $N_2$ gas to the $N_2$ gas ejecting passage 68b is cut off, the external atmosphere of the nozzle tends to enter the $N_2$ gas ejecting passage 68b. This does not occur with the other ejecting passages that feed liquids because the liquid remain inside the passages even after the supply of liquid is cut off. If an SPM atmosphere, for example, enters the $N_2$ gas ejecting passage 68b, it is unfavorable because a mist of the DIW ejected afterwards would be contaminated. In order to prevent this, preferably, a slight amount of $N_2$ gas is constantly fed through the $N_2$ gas ejecting passage 68b so that the $N_2$ gas constantly flows out from each ejection port 62. Similarly, it is as well preferable to make a slight amount of $N_2$ gas constantly flow out from the ejection port 64 in order to maintain the cleanliness inside the ejection port 64.

In the above embodiment, the first bar-shaped portion 60A and second bar-shaped portion 60B of the nozzle 60 are arranged into the V-shaped figure. If the rotating direction of the wafer W during treatment is set as appropriate, the chemical liquid ejected from the first bar-shaped portion 60A is less likely to drop on the second bar-shaped portion 60B, whereby preventing or suppressing contamination of the second bar-shaped portion 60B with the chemical liquid. In addition, part of the rinsing fluid ejected from the second bar-shaped portion 60B reaches the first bar-shaped portion 60A and cleans it. Thus, the nozzle 60 can be maintained clean.

Further, according to the embodiment, when resist films or other residues on the wafer W is to be removed by high temperature SPM cleaning, chemical liquid (SPM) is supplied to the target face (the face to be treated) of the wafer with the target face turned down and the upside of the wafer W being shrouded with the cover member 80 incorporating the heater-heating LED lamp 83. This configuration prevents fumes of the treatment liquid and gas or mist derived from the target object generated below the wafer W from diffusing into the upper region of the wafer. Parts disposed in the upper region of the wafer W such as the chamber inner wall and the internal components of the chamber would not be contaminated nor corroded by the fumes, whereby preventing generation of substances which may contaminate the wafer. Further, the heater incorporated within the cover member 80 heats the wafer substrate to promote the treatment. Since the cover member possesses both the fume shutting off function and the wafer heating function, the number of components can be reduced. In the foregoing embodiment, a cup (the outer cup 56) surrounds the wafer W, so that a substantially closed space communicating with an exhaust line is defined on the lower side of the wafer W. Since SPM cleaning is conducted in this closed space, diffusion of the fumes into the upper region of the wafer W can be prevented, and thus contamination or corrosion of the parts disposed in the upper region such as the chamber inner wall or the internal components of the chamber can be prevented. Particularly in the foregoing embodiment, since the upside of the cup is also covered with the cover member, leakage of the fumes can be reliably prevented.

The apparatus according to the embodiment employs the nozzle including the plurality of ejection ports 61 (62) arranged between a position opposing to the central portion of the wafer W and a position opposing to the peripheral portion of the wafer W, and configured to eject the same kind of treatment fluid from the plurality of ejection ports 61 (62). Thus, the lower surface of the wafer W can be treated with high in-plane uniformity.

The nozzle 60 is configured to form SPM by mixing sulfuric acid and hydrogen peroxide solution immediately before the ejection. This means that heat generated by mixing the sulfuric acid and the hydrogen peroxide solution causes immediately before the SPM is ejected. The sulfuric acid and the hydrogen peroxide solution can be supplied to a position just before the ejection ports 61 at a lower temperature, as compared with a case where the mixing is done beforehand. Consequently, the load on the supply lines for feeding the sulfuric acid and the hydrogen peroxide solution can be reduced.

Since the wafer W is heated by the LED lamps which emit light of a predetermined wavelength, the temperature of the wafer can be rapidly increased.

In the foregoing embodiment, the lift pin plate 20, the treatment fluid supply pipe 40, and the V-shaped nozzle 60 move vertically relative to the retaining plate 30, and the lift pins 22 for supporting the wafer W from below are provided on the lift pin plate 20. Accordingly, in contrast to a conventional apparatus having lift pins which are to be retreated through through-holes formed in a bottom plate to a space below the bottom plate, there will be no or less cleaning liquid left on the lift pins 22 after drying a wafer W, preventing the cleaning liquid from adhering to the back surface of the wafer after the liquid treatment. This is because the lift pins 22 rotate integrally with the lift pin plate 20. In addition, by rotating the lift pins 22 together with the lift pin plate 20, droplets of cleaning liquid remained on the lift pins 22 can be reduced, which allows the back surface of the wafer W to have thereon even less droplets of the cleaning liquid after treatment. The central portion 60C of the V-shaped nozzle 60 is formed so as to close the through-hole 20a in the lift pin plate 20. This prevents the treatment liquid from entering the through-hole 20a provided to pass the treatment fluid supply pipe 40. Additionally, the treatment fluid supply pipe 40 and the V-shaped nozzle 60 move in vertical directions in association with the lift pin plate 20 so that when the treatment fluid supply pipe 40 and the lift pin plate 20 are moved up or down, the central portion 60C of the V-shaped nozzle 60 blocks the through-hole 20a in the lift pin plate 20. Entry of the treatment liquid into the through-hole 20a can be further prevented.

The rotation cup 36 disposed on the retaining plate 30 prevents cleaning liquid from scattering externally from the rotating wafer W during cleaning. Further, due to the substrate retaining member 31 attached on the retaining plate 30, the wafer W can be stably retained during rotation by supporting the wafer from its lateral side.

The foregoing embodiment may be modified as follows.

In the foregoing embodiment, removal of resist films and other substances were done by performing sequentially the chemical liquid cleaning step using SPM, the first DIW rinsing step, the mist ejecting step using DIW and $N_2$ gas, the second DIW rinsing step, and the $N_2$ spin drying step, in that order. However, the treatment conducted by a substrate treatment apparatus in the foregoing embodiment is not limited to this. For example, chemical liquid cleaning step may be performed as a wet etching process using a mixed acid (a mixture of sulfuric acid and nitric acid). In this case, the rinsing step, the mist ejecting step, and the $N_2$ spin drying process may be performed in manner as previously mentioned.

The first or second DIW rinsing step may be omitted. Any other appropriate inert gas may be used instead of $N_2$ gas.

Heating lamps other than the LED lamps, for instance halogen lamps, may be employed to heat the wafer. However, LED lamps are more preferred in terms of heating efficiency and space efficiency.

The foregoing embodiment employs an assembly comprising the lift pin plate 20 and the retaining plate 30 integrated with the rotation cup 36, as the substrate retaining unit of a so-called "spin chuck", in other words a mechanism for retaining and rotating the wafer. However, the V-shaped nozzle 60 of the foregoing embodiment may be combined with any of various types of spin chucks to construct a liquid treatment apparatus as long as the spin chuck is configured to hold the peripheral edge of the wafer.

The invention claimed is:

1. A liquid treatment apparatus comprising:
    a substrate retaining unit comprising a retaining member configured to hold a peripheral edge of a substrate to retain the substrate horizontally;
    a rotational driving unit configured to rotate the substrate retaining unit; and
    a nozzle disposed below a lower surface of the substrate retained by the substrate retaining unit, the nozzle comprising a plurality of first ejection ports provided to eject a chemical liquid towards the lower surface of the substrate retained by the substrate retaining unit and a plurality of second ejection ports provided to eject a rinsing fluid towards the lower surface of the substrate retained by the substrate retaining unit;
    wherein:
    the nozzle comprises a first portion extending from a position opposing to a peripheral portion of the substrate towards a position opposing to a central portion of the substrate retained by the substrate retaining unit, the plurality of first ejection ports are arranged between a position opposing to a peripheral portion of the substrate towards a position opposing to a central portion of the substrate retained by the substrate retaining unit, and at least part of the plurality of first ejection ports are arranged in the first portion;
    the nozzle comprises a second portion extending from a position opposing to a peripheral portion of the substrate towards a position opposing to a central portion of the substrate retained by the substrate retaining unit, the plurality of second ejection ports are arranged between a position opposing to a peripheral portion of the substrate towards a position opposing to a central portion of the substrate retained by the substrate retaining unit, and at least part of the plurality of second ejection ports are arranged in the second portion;
    the first portion and the second portion are arranged to form a V-shaped figure; and
    the first portion is disposed at an angular position advanced through an angle from the second portion in a rotating direction of the substrate rotated by the rotational driving unit.

2. The liquid treatment apparatus according to claim 1, wherein the angle is an acute angle.

3. The liquid treatment apparatus according to claim 1, wherein each of the first ejection ports is configured to eject the chemical liquid towards the lower substrate surface in a direction inclined to the rotating direction of the substrate rotated by the rotation driving unit.

4. The liquid treatment apparatus according to claim 1, wherein each of the second ejection ports is configured to eject, as the rinsing fluid, at least one of deionized water (DIW) and droplets of a mixture of DIW and an inert gas, towards the substrate.

5. The liquid treatment apparatus according to claim 4, wherein each of the second ejection ports is configured to eject the DIW towards the lower surface of the substrate in a direction inclined to the rotating direction of the substrate rotated by the rotation driving unit, when the second ejection ports eject the DIW as the rinsing fluid.

* * * * *